United States Patent
Hachuda

(10) Patent No.: US 11,522,327 B2
(45) Date of Patent: Dec. 6, 2022

(54) OPENING / CLOSING MECHANISM OF OPENING / CLOSING BODY

(71) Applicant: ENPLAS CORPORATION, Kawaguchi (JP)

(72) Inventor: Osamu Hachuda, Kawaguchi (JP)

(73) Assignee: ENPLAS CORPORATION, Saitama (JP)

( * ) Notice: Subject to any disclaimer, the term of this patent is extended or adjusted under 35 U.S.C. 154(b) by 235 days.

(21) Appl. No.: 16/957,339

(22) PCT Filed: Dec. 13, 2018

(86) PCT No.: PCT/JP2018/045834
§ 371 (c)(1),
(2) Date: Jun. 23, 2020

(87) PCT Pub. No.: WO2019/131169
PCT Pub. Date: Jul. 4, 2019

(65) Prior Publication Data
US 2020/0335923 A1    Oct. 22, 2020

(30) Foreign Application Priority Data

Dec. 27, 2017    (JP) .............................. JP2017-252362

(51) Int. Cl.
*H01R 12/88* (2011.01)
*H01R 33/76* (2006.01)
(Continued)

(52) U.S. Cl.
CPC ......... *H01R 33/7607* (2013.01); *B25B 5/163* (2013.01); *H01R 12/85* (2013.01); *H01R 12/88* (2013.01)

(58) Field of Classification Search
None
See application file for complete search history.

(56) References Cited

U.S. PATENT DOCUMENTS 7,214,077 B2 *   5/2007   Lu .................. H05K 5/0013
                                                        439/157
7,575,460 B2 *   8/2009   Kenzo ............. H05K 7/1053
                                                        439/342
(Continued)

FOREIGN PATENT DOCUMENTS

JP          1-129037         9/1989
JP          11-54670         2/1999
(Continued)

OTHER PUBLICATIONS

Extended European Search Report for European Application No. 18894521 dated Aug. 16, 2021.
(Continued)

*Primary Examiner* — Felix O Figueroa
(74) *Attorney, Agent, or Firm* — Staas & Halsey LLP

(57) ABSTRACT

An opening/closing mechanism of a cover member that can easily push down the cover member by the lever member even if the force from the base member side to the cover member is increased, improving the operability of the lever member. A solution is that the lever member 17 is rotatably supported to the base member 23 by the first shaft 31, the link plate 29 is mounted to the lever member 17 by the second shaft 32, the cover member 15 is mounted to the link plate 29 by the third shaft 33, and the link plate 29 is rotated around the axis of the first shaft 31 in the direction in which the lever member 17 closes, so that the link plate 29 moves through the second shaft 32, and the link plate 29 moves, so that the cover member 15 is depressed through the third shaft 33.

13 Claims, 17 Drawing Sheets

(51) Int. Cl.
*B25B 5/16* (2006.01)
*H01R 12/85* (2011.01)

(56) References Cited

U.S. PATENT DOCUMENTS

| | | | |
|---|---|---|---|
| 7,815,456 B2* | 10/2010 | Kunioka | H01R 13/2421 |
| | | | 439/73 |
| 7,862,362 B2* | 1/2011 | Koehler | G01R 1/0466 |
| | | | 439/331 |
| 2006/0049567 A1 | 3/2006 | Nishimura et al. | |
| 2008/0229852 A1 | 9/2008 | Hachuda | |
| 2009/0212806 A1 | 8/2009 | Schmegner et al. | |
| 2010/0159731 A1 | 6/2010 | Kunioka et al. | |

FOREIGN PATENT DOCUMENTS

| | | |
|---|---|---|
| JP | 2004-227904 A | 8/2004 |
| JP | 4025323 | 10/2007 |
| WO | 2004/018154 A1 | 3/2004 |

OTHER PUBLICATIONS

International Search Report, PCT/ISA/210, dated Jul. 4, 2019, in corresponding International Patent Application No. PCT/JP2018/045834.
Written Opinion of the International Searching Authority, PCT/ISA/237, dated Jul. 4, 2019, in corresponding International Patent Application No. PCT/JP2018/045834.

* cited by examiner

OPENING / CLOSING MECHANISM OF OPENING / CLOSING BODY

CROSS-REFERENCE TO RELATED APPLICATIONS

This application is a U.S. National Stage Application which claims the benefit under 35 U.S.C. § 371 of International Patent Application No. PCT/JP2018/045834 filed on Dec. 13, 2018, which claims foreign priority benefit under 35 U.S.C. § 119 of Japanese Patent Application No. 2017-252362 filed on Dec. 27, 2017, in the Japanese Intellectual Property Office, the contents of all of which are incorporated herein by reference.

TECHNICAL FIELD

The present invention relates to an opening/closing mechanism of an opening/closing body comprising a cover member for opening and closing a base portion and a lever member for pushing down the cover member.

BACKGROUND ART

Conventionally, there are various types of opening/closing bodies in which a cover member is provided to be opened and closed with respect to a base portion, and in which a lever member is operated at the state that the cover member is closed, so that the cover member is pushed down to the base portion.

IC sockets with contact pins are known as sockets for electrical component for electrically connecting electrical component, such as semiconductor devices (hereinafter referred to as IC package).

In the IC socket, a socket, body with a plurality of contact pins is disposed on the wiring substrate, and when the IC package to be inspected is mounted, the terminals of the IC package and the electrodes of the wiring substrate are electrically connected through the contact pins to enable testing of electrical continuity, etc.

As such an IC socket, a clamshell type is known in which the IC package is enclosed in the socket body, the cover member is closed, and the cover member is pushed down by the lever member so that many terminals of the IC package are contacted with each contact pin (see, e.g., Patent Document 1).

PRIOR ART DOCUMENT

Patent Document

Patent Document 1: Japanese Patent No. 4025323

SUMMARY OF INVENTION

Problems to be Solved by the Invention

However, in the opening/closing mechanism used in a socket for electric component of a clamshell type such as in the prior art Patent Document 1, the proximal end of the cover member is pivotally connected to the socket body, the proximal end of the lever member is pivotally connected to the distal end of the cover member, and a locking structure for locking to the socket body is provided to the proximal end of the lever member.

In order to accommodate an electrical component in the socket body and to mount it by pressing with a cover member, the cover member is rotated and closed after accommodation of the electrical component, and the engagement portion of the lever member is locked and rotated to the socket body. The cover member is pushed down due to the shape of the engagement portion, and the electrical component is pressed against the contact pin.

At this time, the reaction force of the plurality of contact pins is loaded on the cover member, so that the lever member is loaded with the reaction force in the direction of opening. As a result, the contact pin increases in number as the terminal increases due to the increase in the size of the electrical component, and the force applied to the cover member from the socket body increases. Then, it is difficult to push down the cover member by the lever member, and the operability of the lever member is deteriorated.

Accordingly, the object of the present invention is to provide an opening/closing mechanism of an opening/closing body that allows the cover member to be easily pushed down by the lever member even if the force received by the cover member from the base portion is increased, thereby improving the operability of the lever member.

Means for Solving Problems

To achieve this problem, the invention according to an embodiment is characterized in an opening/closing mechanism of an opening/closing body, comprising:
- a first shaft by which a lever member is rotatably supported on a base portion,
- a second shaft by which a link plate is attached to the lever member, and
- a third shaft by which a cover member is attached to the link plate,
- wherein the link plate operates through the second shaft by rotating the lever member to a closing direction of the lever member about a first shaft line of the first shaft, and
- the cover member is pushed down through the third shaft by operating of the link plate.

The invention according to an embodiment is characterized in that the third shaft is vertically movably supported on the base portion.

The invention according to an embodiment is characterized in that the second shaft is disposed lateral one side with respect to the first shaft at the state that the lever member is open, and the second shaft moves below the first shaft by rotating the lever member to the closing direction about the first shaft line of the first shaft.

The invention according to an embodiment is characterized in that a second shaft line of the second shaft moves beyond right below the first shaft line of the first shaft from the lateral one side of the first shaft line of the first shaft to lateral other side of the first shaft line of the first shaft.

The invention according to an embodiment is characterized in that a plurality of the link plates are provided,
- the lever member is disposed between the plurality of the link plates,
- the first shaft is passed through a first escape hole of the plurality of the link plates, and
- the third shaft is passed through a third escape hole of the lever plate.

In the invention according to an embodiment, the base portion includes a plurality of base connection pieces, and the plurality of base connection pieces and the lever member are disposed between the plurality of connection pieces and the first shaft is bridged between the plurality of connection pieces.

Advantageous Effect of Invention

According to an embodiment, the lever member supported rotatably on the base portion by the first shaft and the cover member are mounted to the link plate by the second shaft and the third shaft, and if the lever member is rotated in the direction of closing, the link plate operates so that the cover member is pushed down.

Thus, the force received by the cover member is loaded to the lever member via the link plate, and the disposition of the link plate and the second shaft and the third shaft can reduce the force loaded to the lever member.

Accordingly, it is possible to provide an opening/closing mechanism of an opening/closing body that allows the cover member to be pushed down easily by the lever member even if the force received by the cover member from the base portion side is increased, thereby improving the operability of the lever member.

According to an embodiment, the third shaft for attaching the cover member to the link plate is vertically movably supported on the base portion, so that the cover member can be directly connected to the base portion and can be raised and lowered at a predetermined position. Accordingly, the cover member can be opened and closed in the predetermined position with respect to the base portion to raise and lower the cover member.

According to an embodiment, the second shaft is disposed lateral one side with respect to the first shaft at the state that the lever member is open, and the second shaft moves below the first shaft by rotating the lever member to the closing direction about the first shaft line of the first shaft. Thus, when an upward force is loaded to the cover member, this upward force is transferred to the second shaft via the third shaft and the link plate. While the second shaft is positioned laterally with respect to the first shaft, the upward force is loaded to open the lever member in the opening direction and it is necessary to operate the lever member against this upward force. However, if the lever member is rotated around the first shaft and the second shaft is moved below the first shaft, the upward force from the cover member is more supported on the first shaft, thereby reducing the force loaded in the direction of opening the lever member. Therefore, by rotating more in the closing direction, the force for operating the lever member can be reduced.

According to an embodiment, a second shaft line of the second shaft moves beyond right below the first shaft line of the first shaft from the lateral one side of the first shaft line of the first shaft to lateral other side of the first shaft line of the first shaft. Therefore, when the lever member is rotated in the closing direction and exceeds right below the first shaft line, the upward force from the cover member is loaded on the opposite side of the link plate beyond the first shaft line. Then, the link plate is loaded to rotate in the opposite direction to bias the lever member in the closing direction. As a result, the lever member rotated to close the cover member is loaded with a force in the closing direction, thereby allowing that as if the lever member would be locked.

According to an embodiment, since a plurality of link plates are provided and the lever member is disposed between the plurality of link plates, the force received by the cover member is transmitted to the link plates on both sides of the lever member, and the lever member is loaded balanced from the link plates on both sides. Therefore, even if a large force is loaded from the cover member, the lever member can be operated smoothly and operability can be ensured.

The lever member is disposed between the plurality of the link plates, the first shaft is passed through a first escape hole of the plurality of the link plates, and the third shaft is passed through a third escape hole of the lever member. Thus, the plurality of link plates and the lever member are combined to form a structure which secures strength by mutually reinforcing. Therefore, even if a large force is loaded from the cover member, deformation, etc. is difficult to occur, and the operability of the lever member can be ensured.

According to an embodiment, the base portion includes a plurality of base connection pieces, and the plurality of link plates and the lever member are disposed between the plurality of base connection pieces and the first shaft is bridged between the plurality of base connection pieces. Therefore, the plurality of link plates and lever member can be stably supported, and stable operation is possible even if a large force is loaded from the cover member.

EMBODIMENT OF INVENTION

Hereinafter, embodiments of the present invention will be described in detail with reference to figures.

FIGS. 1-19 illustrate an embodiment of the present invention.

The IC socket 10, as a "socket for electrical component" in this embodiment, is disposed on a wiring substrate (not shown) and is used, for example, in a test device for electrical continuity testing, such as a burn-in test for an IC package.

Figure 1:
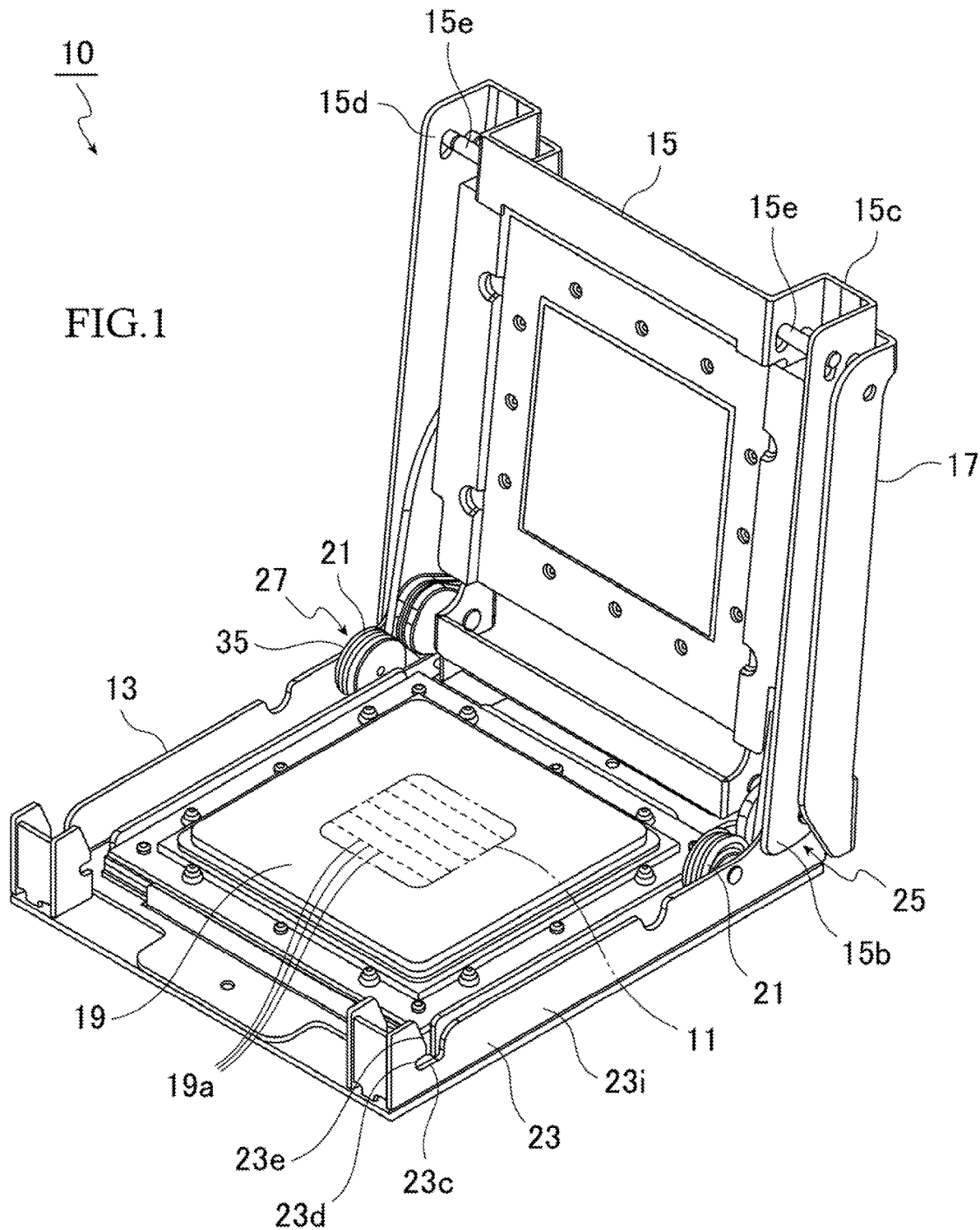
FIG. 1 illustrates the upper side of the IC socket according to an embodiment of the present invention and is a perspective view of the front side when the opening/closing mechanism is opened.
Figure 2:
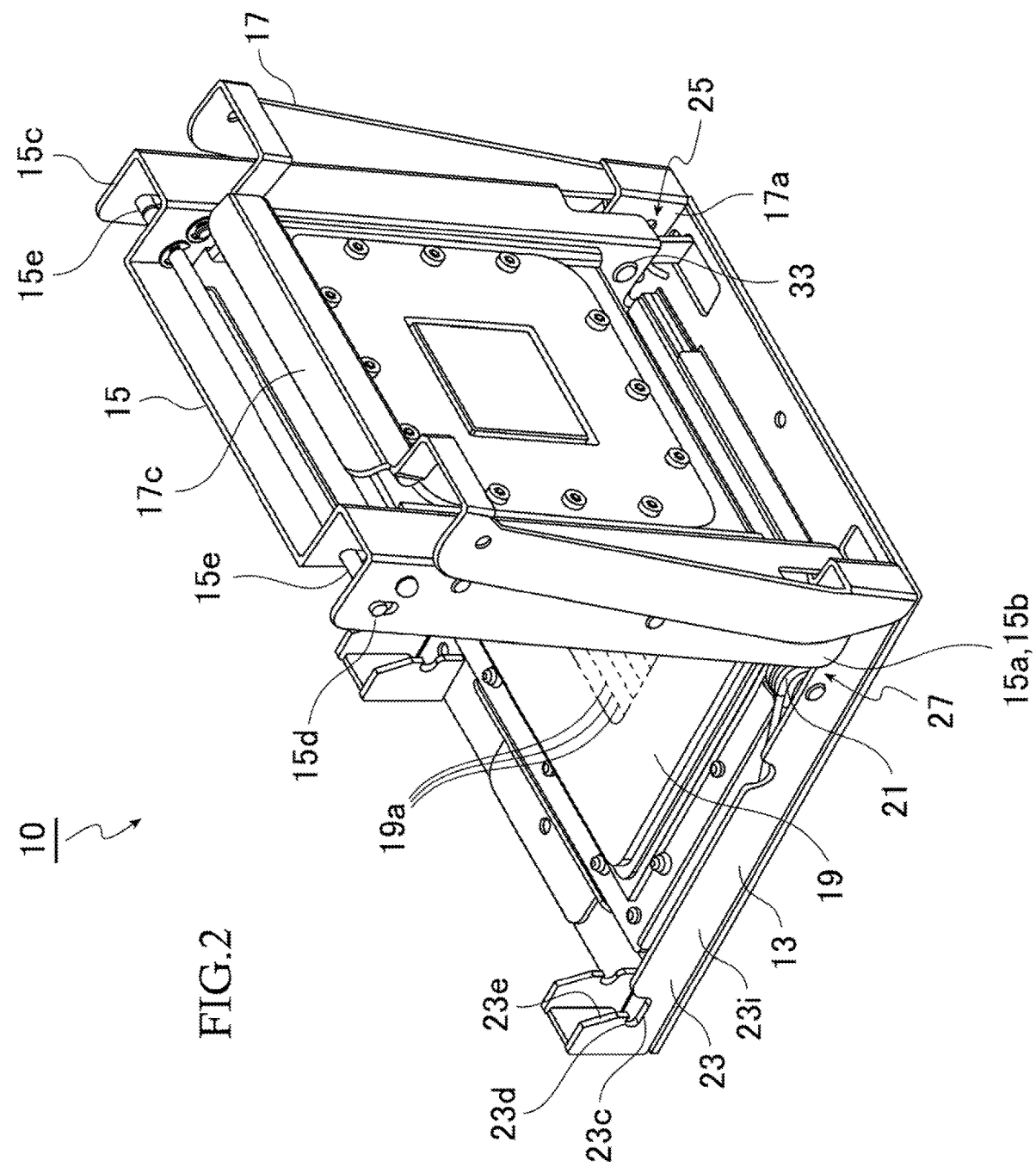
FIG. 2 illustrates the upper side of the IC socket according the embodiment of the present invention and is a perspective view of the back side when the opening/closing mechanism is opened.

As shown in FIGS. 1 and 2, the IC socket 10 includes a socket body 13 for accommodating the IC package 11 as an "electrical component" on the top surface, a cover member 15 for pressing the IC package 11 accommodated in the socket body 13, a lever member 17 for pressing the cover member 15, and a spring member 21 for biasing the cover member 15 in the direction in which the cover member 15 opens.

The IC socket 10 of this embodiment comprises an opening/closing body in which the cover member 15 and the lever member 17 mounted on the socket body 13 are rotated to be openable/closable. As shown in FIGS. 1-4, the IC socket 10 includes an opening/closing mechanism in which the cover member 15 and the lever member 17 are rotatably coupled to one edge of the base portion 23 of the socket body 13.

In the following description, the proximal end side indicates the side edge side at which the cover member 15 and the lever member 17 are rotatably connected to the socket body 13, and the distal end side indicates the opposite side edge side.

Figure 5:
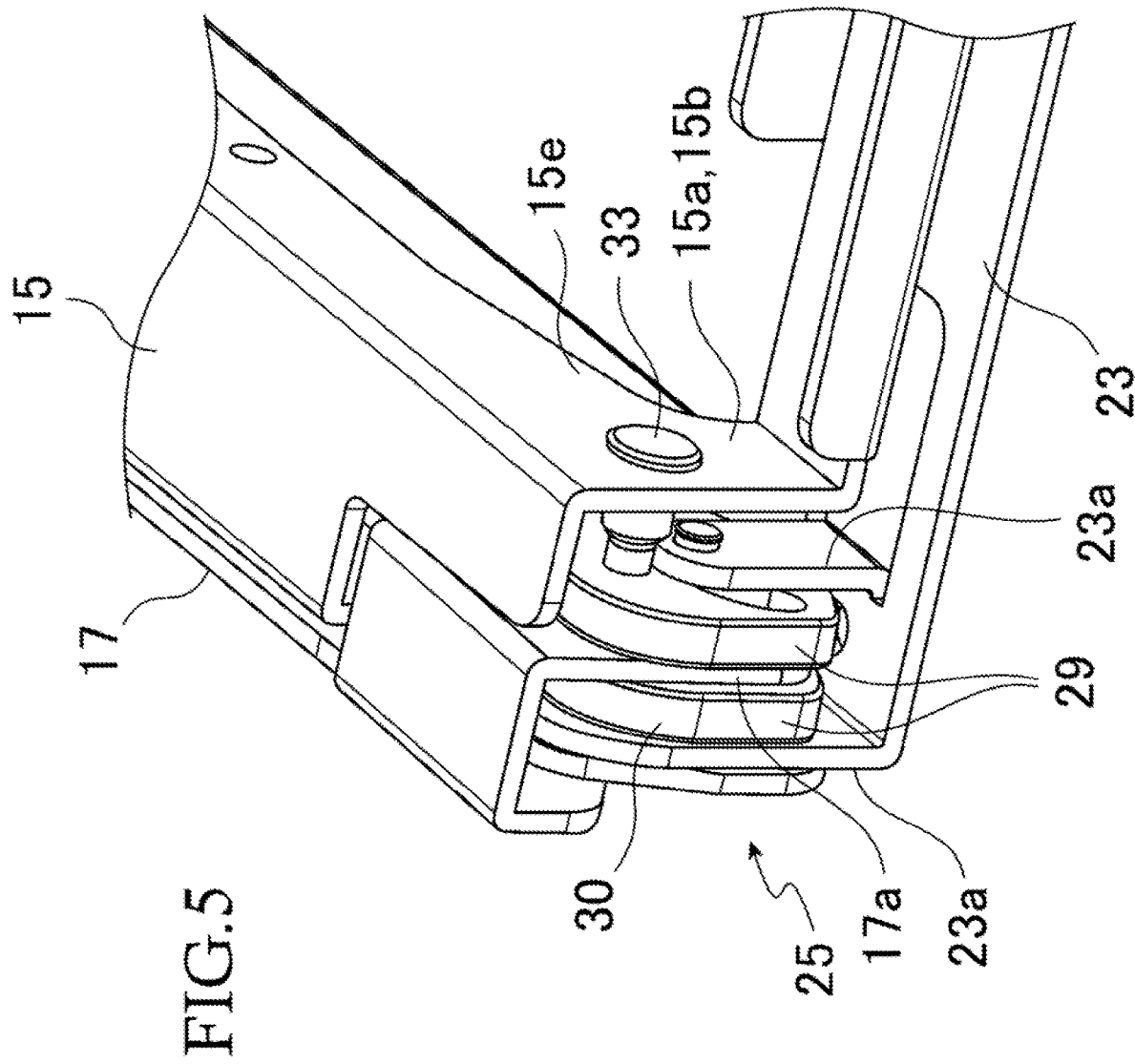
FIG. 5 is a partial perspective view illustrating an opening/closing mechanism of an IC socket according to the embodiment of the present invention.
Figure 6:
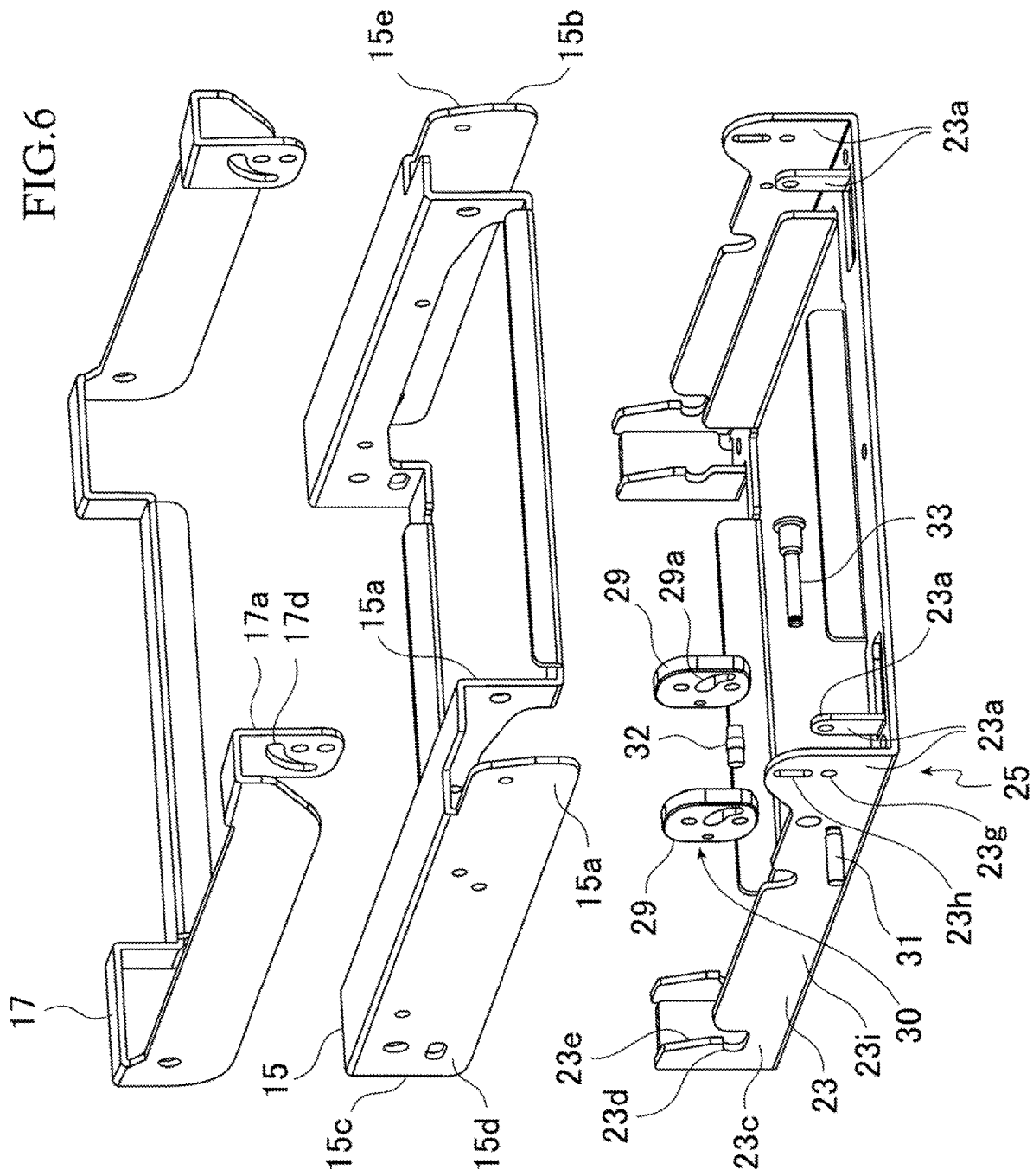
FIG. 6 is an exploded perspective view illustrating an IC socket according to the embodiment of the present invention.
Figure 14:
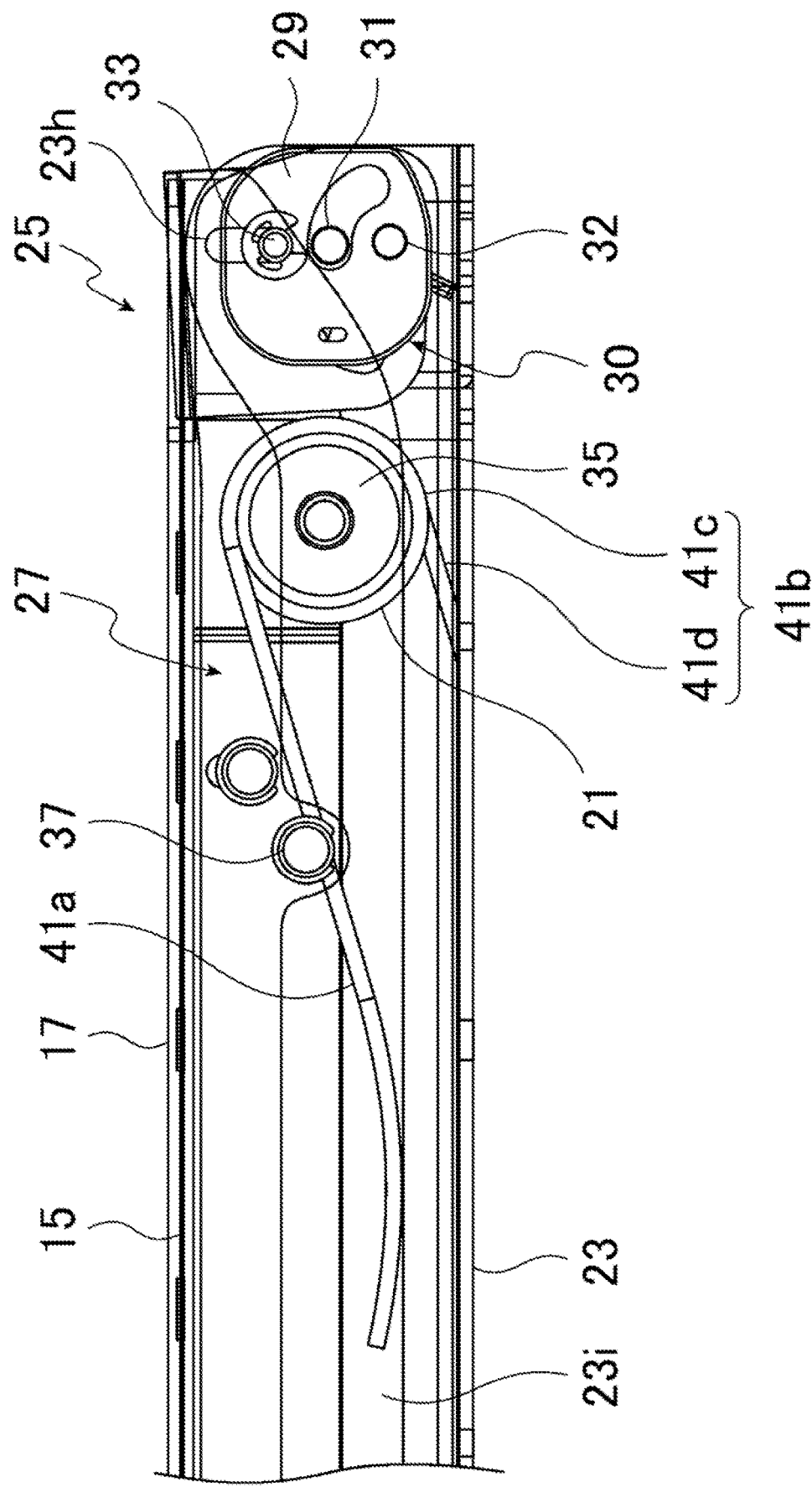
FIG. 14 is a partial projection view explaining the biasing means of an IC socket according to the embodiment of the present invention.

The opening/closing mechanism includes a pressing means 25 as shown in FIGS. 5 and 6 that presses the cover member 15 down by closing the lever member 17 while the cover member 15 is closed, and the opening/closing mechanism includes a biasing means 27 as shown in FIG. 14 for biasing the cover member 15 in the direction that the cover member 15 opens.

First, the socket body 13 includes a metal base portion 23 and a contact pin unit 19 which is disposed inside the base portion 23 and has a plurality of contact pins 19a, as shown in FIG. 1.

A housing portion for the IC package 11 is provided at the upper side of the contact pin unit 19. By pressing down the IC package 11 located at the housing portion from above, the terminals on the lower surface of the IC package 11 are able to contact the plurality of contact pins 19a.

Figure 7:
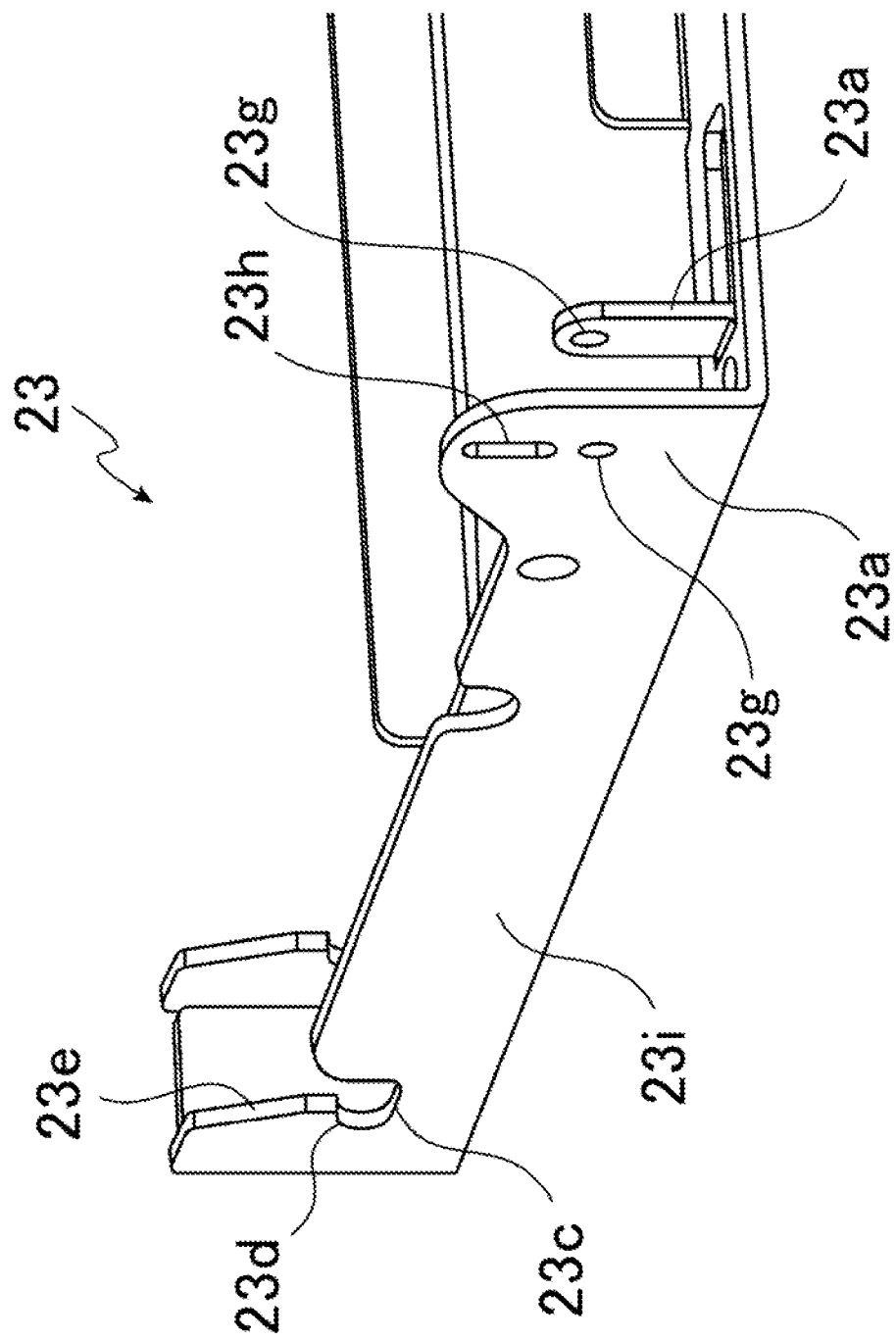
FIG. 7 is a partial perspective view illustrating the base portion of the socket body according to the embodiment of the present invention.

The base portion 23 illustrated in FIG. 7 is frame-shaped to enclose and support the contact pin unit 19. At both ends of the proximal end side, a plurality of base connection pieces 23a for coupling the cover member 15 and the lever member 17 to the base portion 23 via the pressing means 25 are provided. Each base connection piece 23a is formed in a flat plate along the rotational direction of the cover member 15 and the lever member 17 and is arranged parallel to each other.

The distal end side of the base portion 23 is provided with a distal end support portion 23c for supporting a cover distal end 15c when the cover member 15 is closed. The distal end support portion 23c is formed in the shape of a bent opening groove. The distal end support portion 23c includes a contact support portion 23d of the horizontal direction supporting the distal end side of the cover member 15 in contact with the distal end side of the cover member 15 in a rotational direction and in an upward direction and a tapered guide portion 23e guiding to the contact support portion 23d while being elastically displaced by pressing against one edge when the distal end side of the cover member 15 is closed.

As shown in FIGS. 1-4, the cover member 15 is formed to be able to press the IC package 11 accommodated in the socket body 13, and the cover proximal end 15b is openably and closably connected to the socket body 13 via a pressing means 25.

Figure 8:
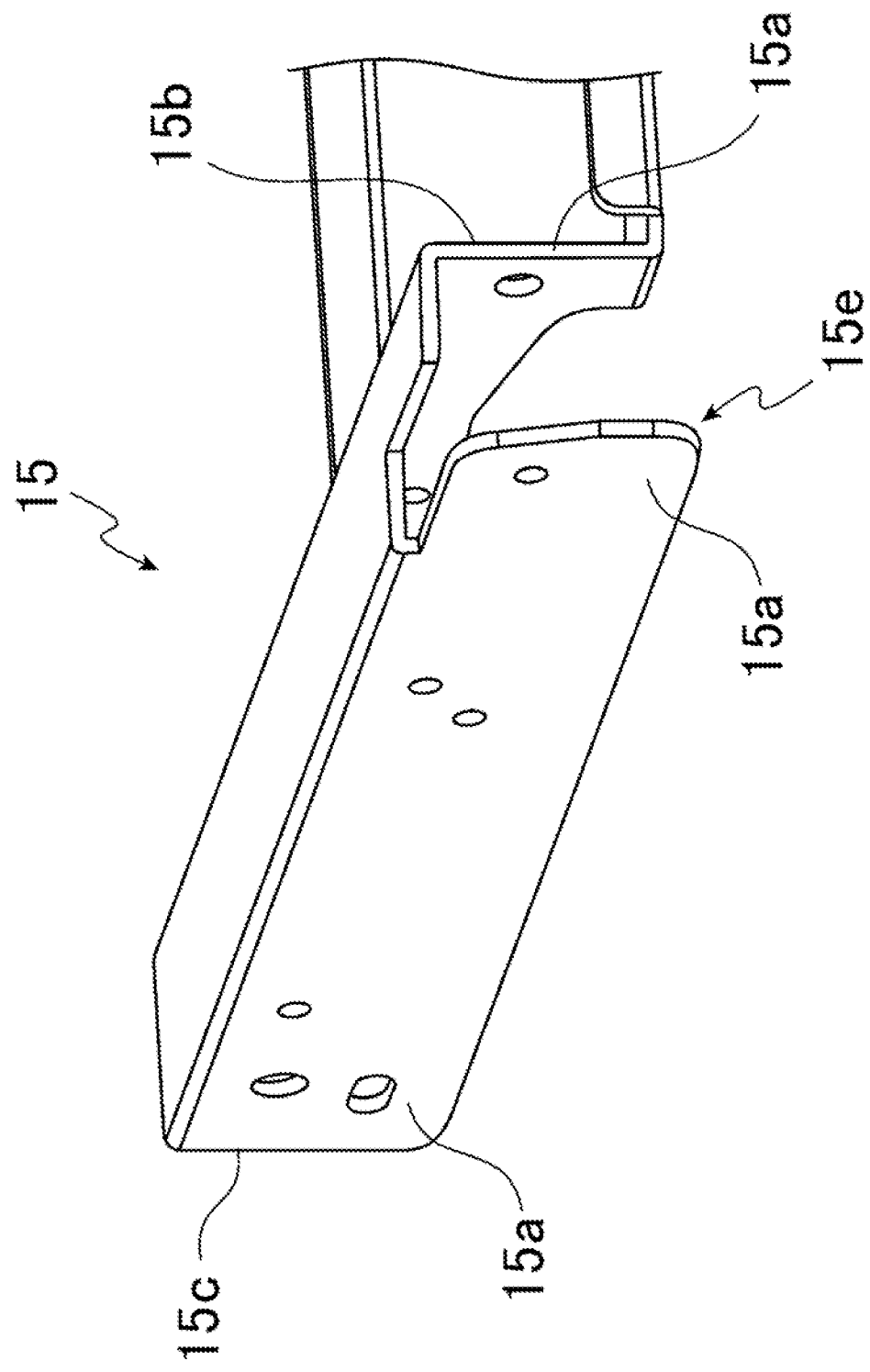
FIG. 8 is a partial perspective view illustrating the cover member of an IC socket according to the embodiment of the present invention.

As shown in FIG. 8, the cover member 15 includes a plurality of cover connection pieces 15a at the cover proximal end 15b. The plurality of cover connection pieces 15a are formed as flat plates along the rotational direction of the cover member 15 and the lever member 17, respectively, and are arranged parallel to each other. These cover connection pieces 15a are disposed on both sides of a pair of base connection pieces 23a provided on the base portion 23 of the socket body 13.

On the other hand, as shown in FIG. 1, the cover distal portion 15c of the cover member 15 is provided with a movable supported portion 15d that is removable from the contact support portion 23d of the distal support portion 23c of the base portion 23. The movable supported portion 15d includes a shaft 15e that can be inserted into the distal support portion 23c. The shaft 15e is biased toward the cover distal end 15c side from the cover proximal end 15b side. For example, by operating an operation piece 17c provided at the distal end of the lever member 17, the shaft 15e can be displaced against the biasing force.

The lever member 17 is formed to be able to press the cover member 15 while the cover member 15 is closed and the proximal end side is connected to the socket body 13 through the pressing means 25.

Figure 9:
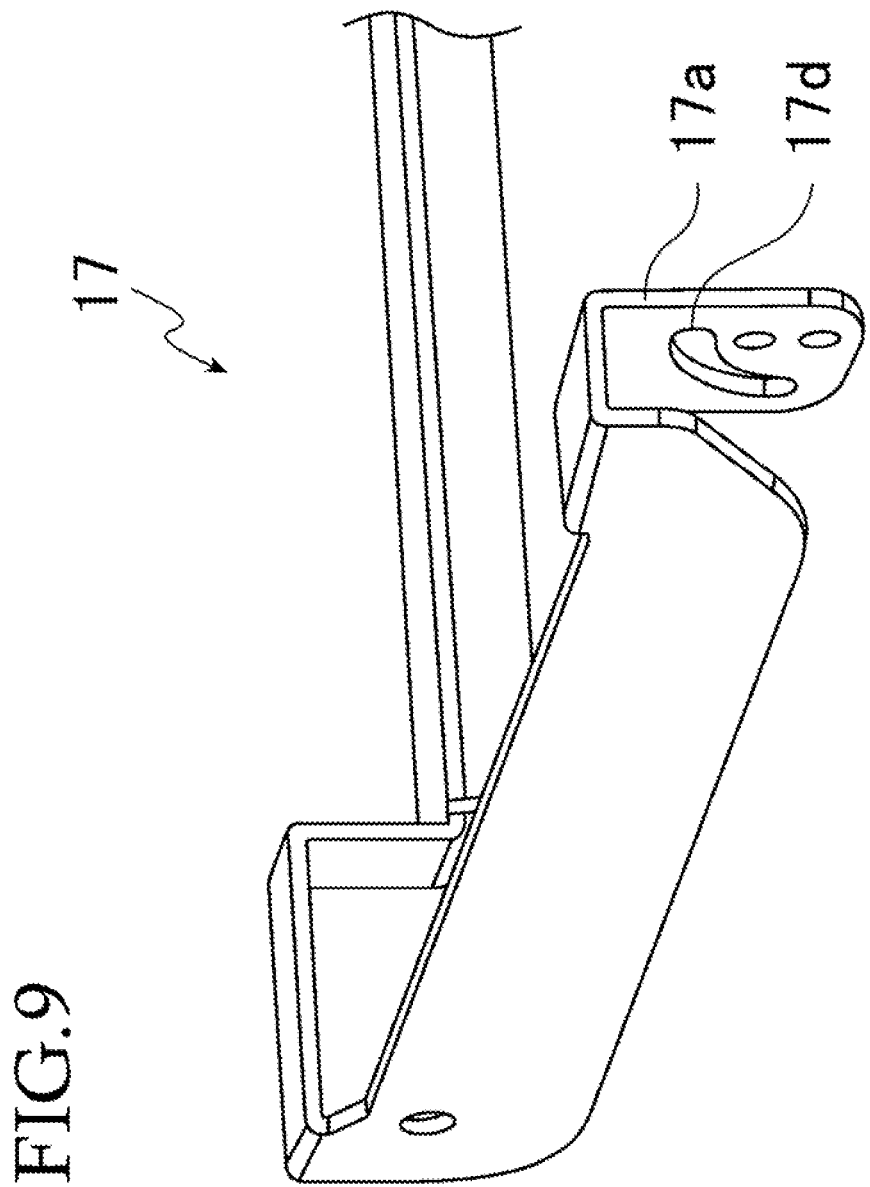
FIG. 9 is a partial perspective view illustrating the lever member of an IC socket according to the embodiment of the present invention.

As shown in FIG. 9, the lever member 17 includes a lever connection piece 17a on the proximal end side. The lever connection piece 17a is formed in a flat plate shape along the rotational direction of the cover member 15 and the lever member 17.

Figure 10:
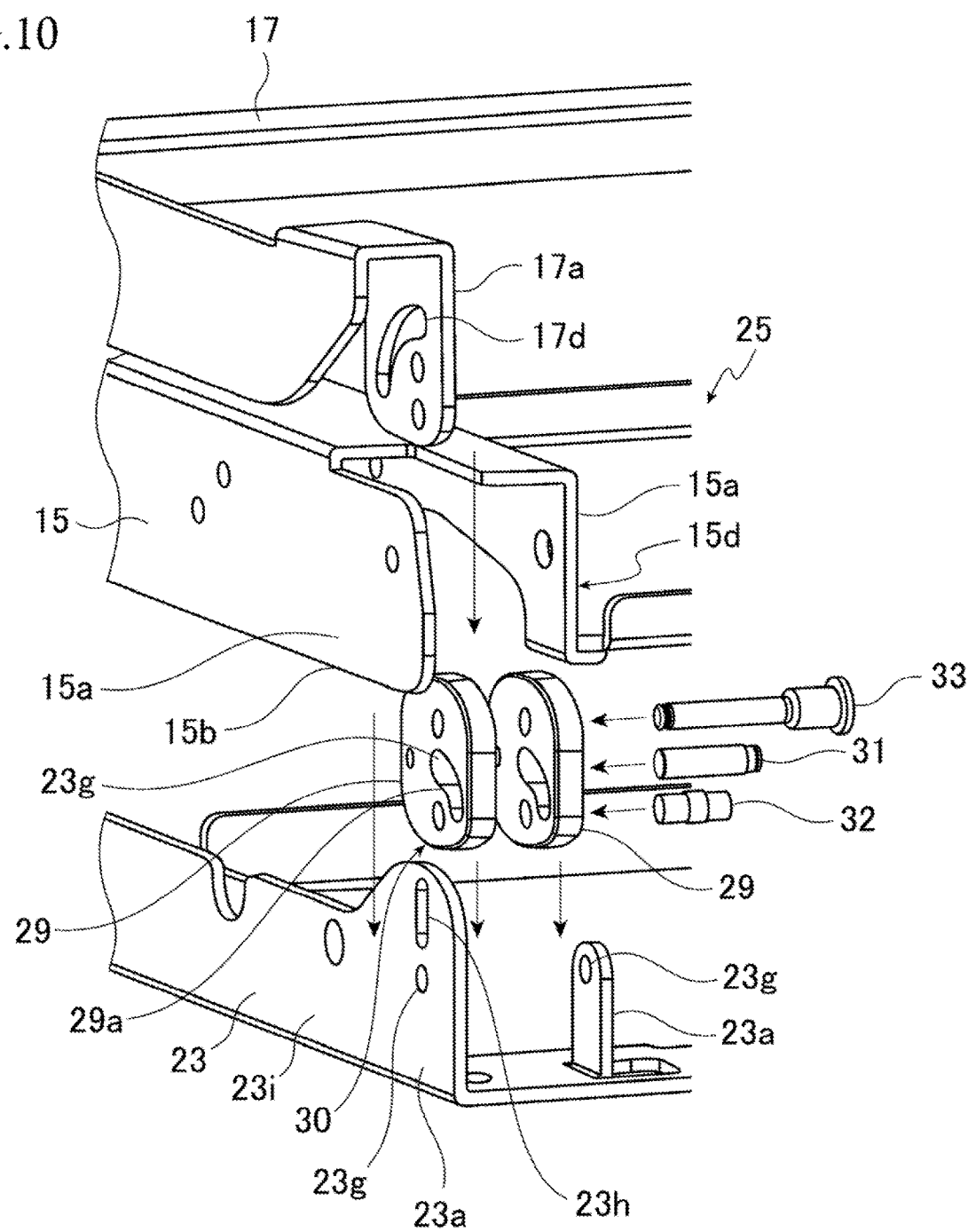
FIG. 10 is an enlarged exploded perspective view illustrating the opening/closing mechanism of an IC socket according to the embodiment of the present invention.

The lever connection piece 17a is disposed between a pair of cover connection pieces 15a of the cover members 15 and a plurality of base connection pieces 23a of the socket body 13, as shown in FIGS. 5 and 10. It is further interposed between the plurality of link plates 29 described below.

Figure 11:
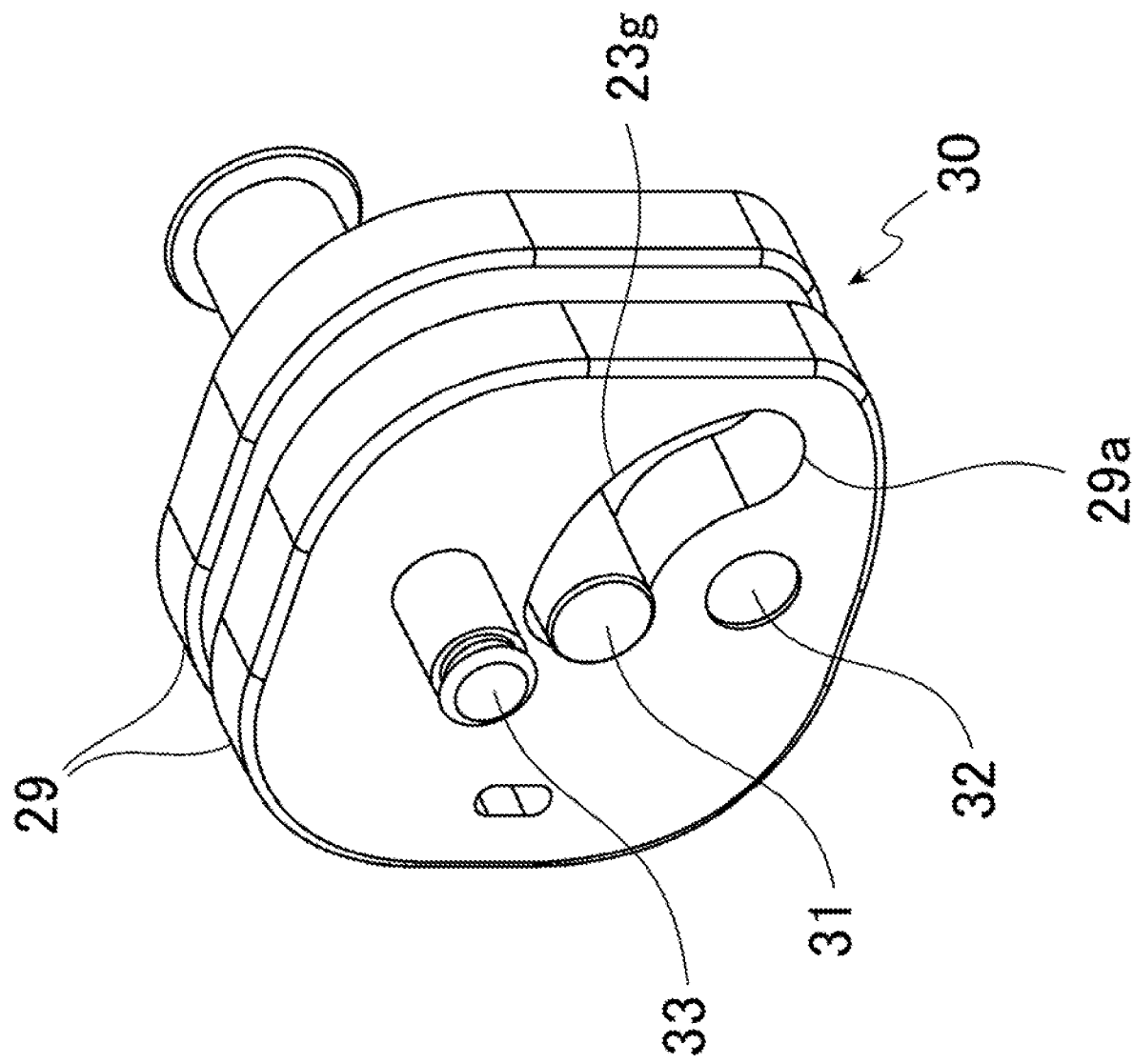
FIG. 11 is a perspective view illustrating a rotating link mechanism of an IC socket according to the embodiment of the present invention.

As shown in FIGS. 5, 10, and 11, the pressing means 25 includes a plurality of base connection pieces 23a of the base portion 23, a cover connection piece 15a of the cover member 15, and a lever connection piece 17a of the lever member 17 arranged parallel to each other in a proximity position, which are connected to each other via a rotating link mechanism 30.

The rotating link mechanism 30 includes a plurality of link plates 29 as the link member and a first shaft 31 to a third shaft 33, as shown in FIG. 11. Here, the plurality of link plates 29 are formed in substantially the same shape and are disposed adjacent to both side of the lever connection piece 17a sandwiched between the base connection pieces 23a. The first shaft 31 to the third shaft 33 are arranged in parallel with each other orthogonal to the rotational direction of the cover member 15 and the lever member 17 to connect the link plates 29 and each of the connection pieces 15a, 17a, 23a.

In the pressing means 25, a first support hole 23g is provided at a position opposite each other below the plurality of base connection pieces 23a and 23a, the first shaft 31 is supported between the first support holes 23g, and the plurality of link plates 29 are pivotally and movably connected to the first shaft 31.

The plurality of link plates 29 are connected together by the second shaft 32 at a position different from the first shaft 31.

Further, in the pressing means 25, the third shaft 33 is provided through the plurality of link plates 29, and the cover connection piece 15a is pivotally connected to the third shaft 33.

One of the base connection pieces 23a has a long hole 23h formed up and down in line along the contact direction of the contact pin 19a in the socket body 13, and the third shaft 33 is vertically movably supported on the straight hole 23h.

This allows the cover member 15 to be connected to the base member 23 pivotally and liftablly.

Next, in the pressing means 25, a first support hole 23g is provided coaxially at the lower position to the straight hole 23h of the one of the base connection pieces 23a and at the opposite position to the lower position of the other base connection pieces 23a, 23a. The shaft center of the first shaft 31 is positioned vertically downward of the shaft center of the third shaft 33.

A lever connection piece 17a is rotatably supported on the first shaft 31. Therefore, the lever member 17 is rotatable relative to the base portion 23 about the shaft center of the first shaft 31.

A second shaft 32 is also attached to the position spaced from the first shaft 31 of the lever connection piece 17a, and the lever connection piece 17a is rotatablly connected relative to the plurality of link plates 29 by the second shaft 32.

And, the plurality of link plates 29 are connected to the cover member 15 by the third shaft 33 at a position different from the first shaft 31 and the second shaft 32.

By rotating the lever member 17 about the shaft center of the first shaft 31 relative to the base portion 23, the cover member 15 is connected to the base portion 23 so as to rotate through the link plates 29.

In the pressing means 25, the lever connection piece 17a is provided with a third escape hole 17d having a substantially arc-like shape centered substantially on the second shaft 32 at the side opposite to the first shaft 31. A third shaft 33 is disposed in the third escape hole 17d through which the third shaft 33 can move relatively.

A first escape hole 29a having an arc-like shape centered on the position of the first shaft 31 is provided between the position of the third shaft 33 and the position of the second shaft 32 in the link plate 29. The first shaft 31 is disposed in the first escape hole 29a through which the first shaft 31 can move relatively.

Next, a biasing means 27 that biases the cover member 15 in the direction of opening will be described.

Figure 16:
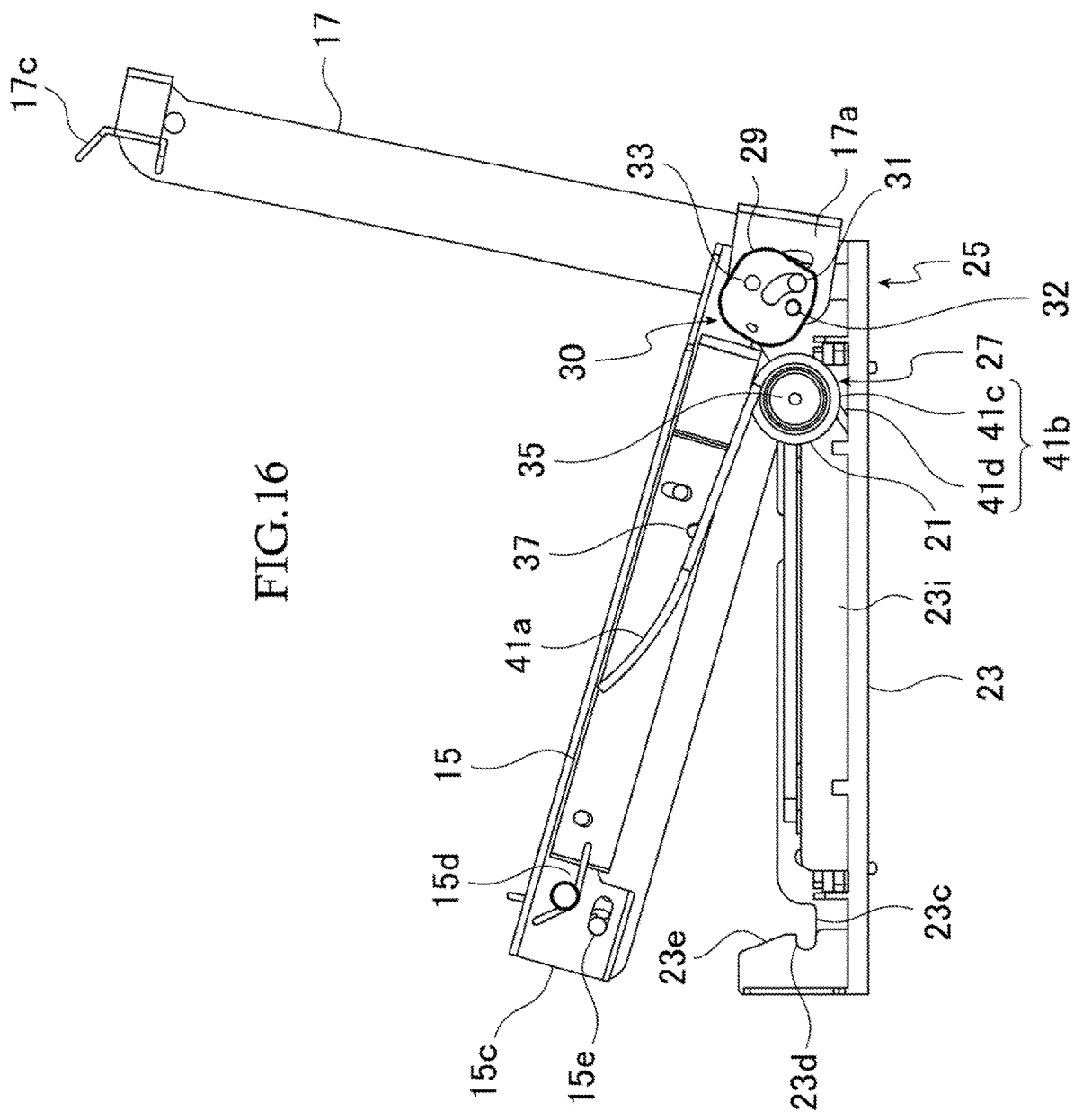
FIG. 16 is a diagram explaining an operation of the biasing means of an IC socket according to the embodiment of the present invention, and shows the state that the cover member is half opened.

As shown in FIG. 16, the biasing means 27 is disposed on the side surface of the base portion 23 and the cover member 15 and between the base portion 23 and the cover member 15.

The biasing means 27 is provided with a spring support portion 35 which is disc-shaped away from the third shaft 33 as the rotating shaft on the front and rear frame piece 23i extending from the proximal end side to the distal end side of the base portion 23, and the spring member 21 is supported on the spring support portion 35.

On the other hand, the cover member 15 is provided with a spring receiver 37 spaced apart from the third shaft 33 for abutting the spring member 21 and inputting the biasing force of the spring member 21 to the cover member 15. Here, the spring receiver 37 comprises a projection extending laterally from the cover member 15.

In this embodiment, the spring member 21 includes a spring base portion 41b disposed on the side of the base portion 23 and a spring extending portion 41a extending from the spring base portion 41b. Here, a screw coil spring comprising a coil portion 41c that a wire member is wound around, a fixing portion 41d that is made of one end of a wire member, and a spring extending portion 41a that is made of the other end of a wire member is used. The spring base portion 41b is configured by the coil portion 41c and the fixing portion 41d.

The spring member 21 is supported by winding the coil portion 41c around the outer circumference of the spring support portion 35, and the fixing portion 41d is fixed to the base portion 23.

On the other hand, the spring extending portion 41a is disposed in contact with the spring receiving portion 37 of the cover member 15 in an opening direction of the cover member 15 without being fixed thereto.

In the biasing means 27, since the spring base portion 41b is supported to the spring support portion 35 disposed apart from the third shaft 33, the distance from the spring base portion 41b of the spring member 21 to the contact position of the spring receiver 37 of the spring extending portion 41a increases as the cover member 15 opens, thereby the biasing means 27 is configured to reduce the biasing force.

In order to accommodate the IC package 11 and connect the electrodes on the lower surface to the contact pins 19a of the socket body 13 in the IC socket 10 having such an opening/closing mechanism, the IC package 11 is housed in place of the socket body 13 while the cover member 15 and the lever member 17 open, as shown in FIGS. 1 and 2.

Then, since the cover member 15 is pivotally connected to the base portion 23, the cover member 15 is rotated in the closing direction about the shaft line of the third shaft 33 and disposed in the closed state. Accordingly, the movable supported portion 15d provided on the distal end side of the cover member 15 is received and supported by the distal end support portion 23c provided on the other side edge side of the socket body 13.

At this time, as shown in FIGS. 12(a) and 13(a), the second shaft 32 is disposed laterally to the first shaft 31 at the state that the lever member 17 is open, and the cover member 15 is disposed at the position H0 most elevated from the socket body 13.

Figure 3:
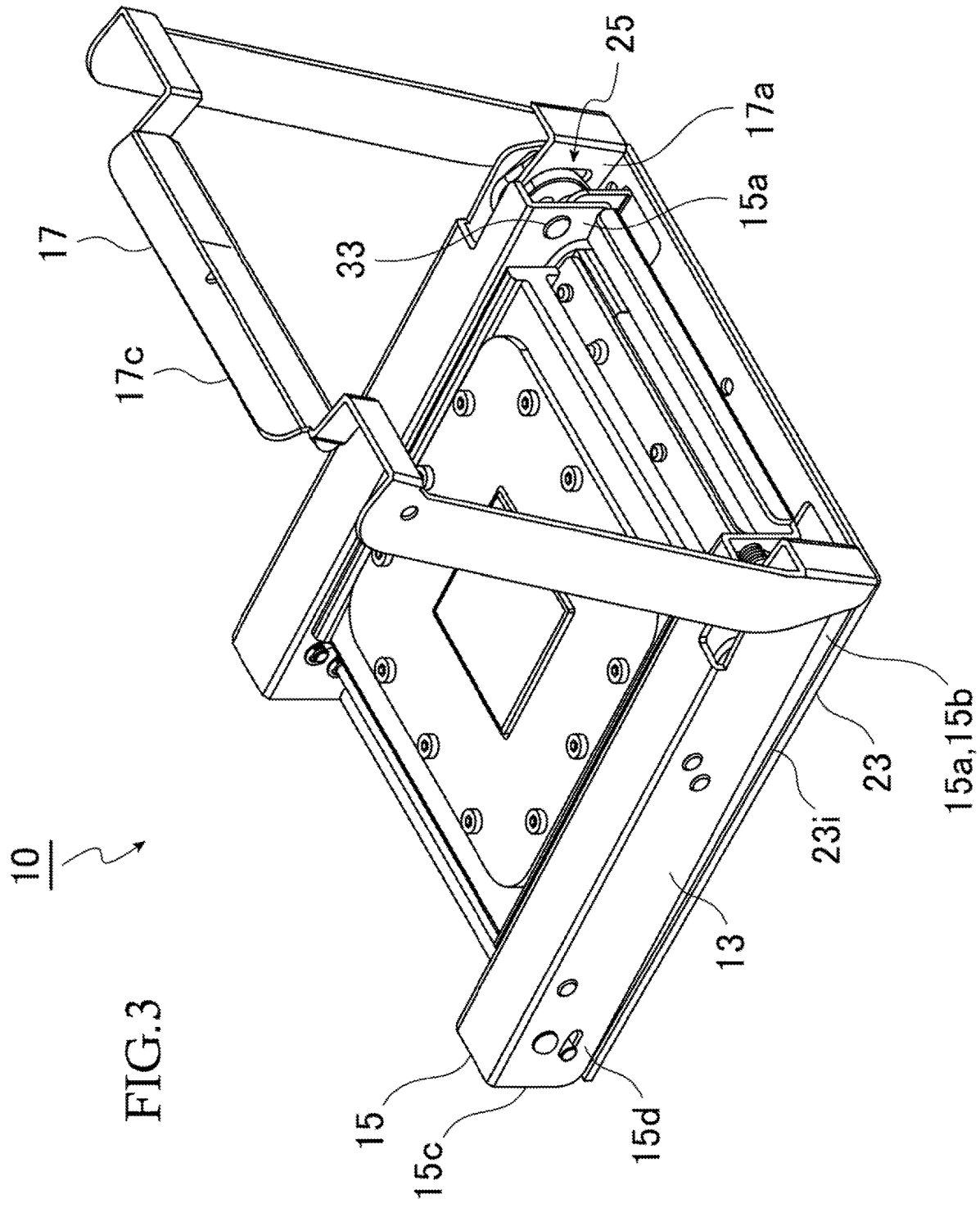
FIG. 3 illustrates the upper side of the IC socket according to the embodiment of the present invention and is a perspective view of the back side when the cover member is closed.
Figure 4:
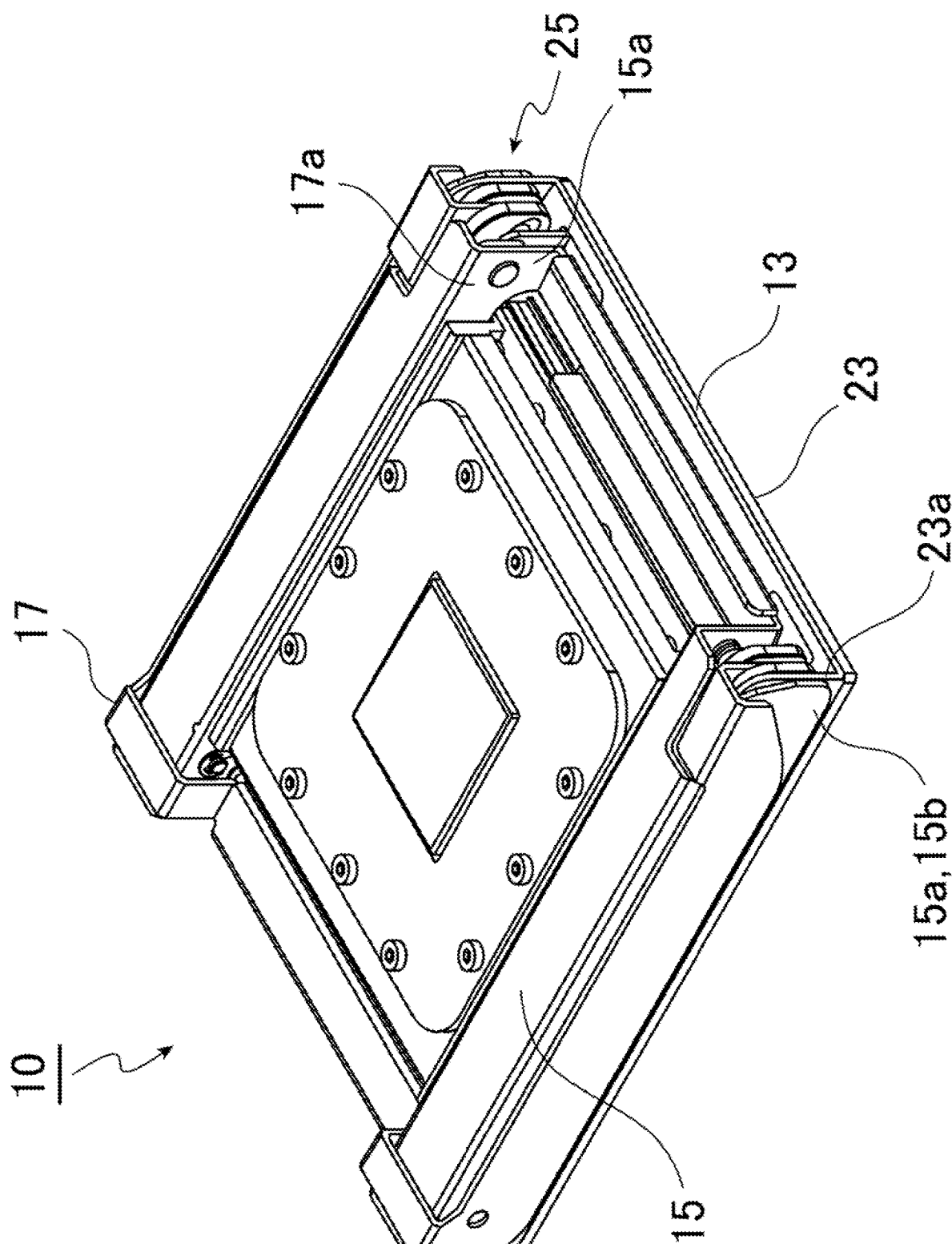
FIG. 4 illustrates the upper side of the IC socket according to the embodiment of the present invention and is a perspective view of the back side when the cover member and lever member are closed.

As shown in FIGS. 3 and 4, when the cover member 15 is closed and the movable supported portion 15d of the cover distal end 15c reaches the distal end support portion 23c of the base portion 23, the shaft 15e of the movable supported portion 15d is pressed and guided by the guide portion 23e of the distal end support portion 23c while resiliently displaced to be locked to the contact support portion 23d. The cover distal end 15c of the cover member 15 is supported on the distal end support portion 23c of the base portion 23.

When the shaft 15e is locked to the distal end support portion 23c, the shaft 15e is in contact with the distal end support portion 23c in the direction in which the shaft 15e opens and is supported to be transversely displaceable and non-rotatable. If the shaft 15e is displaced toward the cover proximal end 15b against the biasing force, the locking between the shaft 15e and the distal end support portion 23c can be released.

When the lever member 17 is going to close at the state that the cover member 15 is closed as shown in FIG. 3, the lever member 17 rotates around the shaft center of the first shaft 31 in the direction in which the lever member 17 closes, as shown in FIG. 13(b). The link plate 29 coupled to the lever member 17 also rotates through the second shaft 32 in the direction in which the lever member 17 closes.

In this way, the second shaft 32 moves downwardly so that it rotates with respect to the first shaft 31, and the link plate 29 and the third shaft 33 move downwardly while these are rotating. At this time, the third shaft 33 is disposed within the long hole 23h of the base portion 23, so that the third shaft 33 moves downward along the long hole 23h.

As a result, the cover member 15 is pushed down to the lower position H1 along the long hole 23h through the third shaft 33. When the cover member 15 is pushed down, the IC package 11 is pushed down and the terminals on the lower surface of the IC package 11 are pressed against the biasing force to a number of contact pins 19a disposed on the socket body 13.

This loads the cover member 15 with a large reaction force of the number of contact pins 19a, and the large force is loaded to the cover member 15 in the direction spaced away from the socket body 13, i.e., upward.

In this state, when the lever member 17 is rotated around the shaft center of the first shaft 31 in the direction of closing, an upward force is loaded to the lever member 17, thereby increasing the operating force.

From this state, as shown in FIG. 13(c), by rotating the lever member 17 about the shaft center of the first shaft 31 in the direction of closing, the second shaft 32 is moved to the position where the second shaft 32 goes below the first shaft 31, and the position of the third shaft 33 can be further lowered, and the cover member 15 can be lowered to the lower position H2 which is most proximal to the socket body 13.

This allows the IC package 11 to be pushed down most by the cover member 15, and a number of solder balls on the lower surface of the IC package 11 can be contacted to the number of contact pins 19a disposed on the socket body 13 at a desired contact pressure.

In this embodiment, by further rotating the lever member 17, the shaft center of the second shaft 32 moves from one side of the shaft center of the first shaft 31 to the other side beyond right below the shaft center of the first shaft 31, thereby finishing operating the lever member 17 to the closing direction.

In this state, an electrical continuity test, such as a burn-in test, is performed on the IC package 11, and the like.

Figure 15:
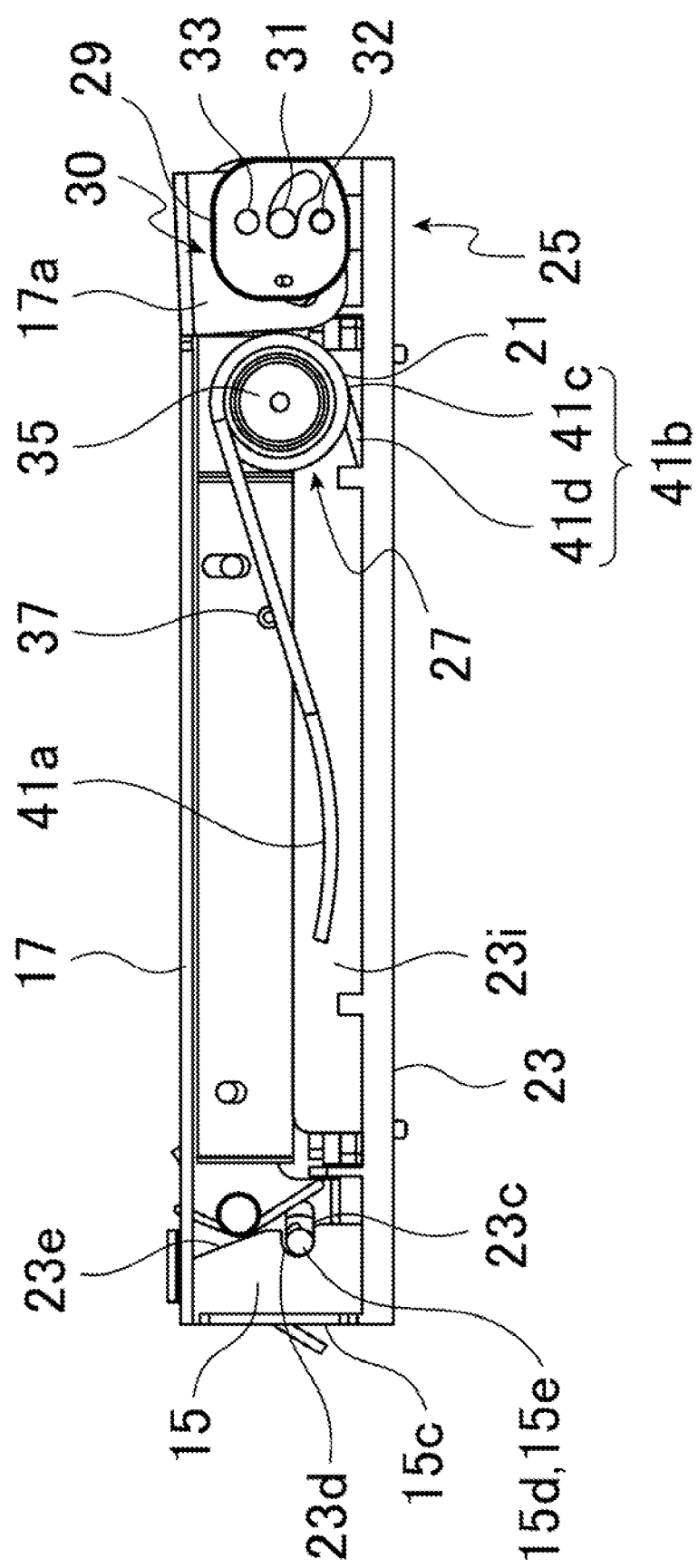
FIG. 15 is a diagram explaining an operation of the biasing means of an IC socket according to the embodiment of the present invention, and shows the state that the cover member is fully closed.

In order to take out the IC package 11 from the IC socket 10, the locking between the shaft 15e of the movable supported portion 15d of the cover member 15 and the distal end support portion 23c of the base portion 23 are released as shown in FIG. 16, from the state that the cover member 15 is fully closed as shown in FIG. 15.

As shown in FIG. 16, when the lever member 17 is rotated in the direction of opening, since the cover member 15 is biased in the direction of opening with respect to the base portion 23 by the biasing means 27, the cover member 15 is rotated in the direction of opening by the biasing force loaded from the spring extending portion 41a of the spring member 21.

In this case, since the spring support portion 35 is provided spaced from the rotation shaft that serves as the rotation center of the cover member 15, the abutting position in the spring extending portion 41a abutting with the spring receiver 37 of the cover member 15 changes. Specifically, the distance from the spring base portion 41b of the spring member 21 to the abutting position in the spring extending portion 41a abutting with the spring receiver 37 increases in accordance with the rotation of the cover member 15. Therefore, the spring member 21 reduces the biasing force that rotates the cover member 15 in the direction of lifting and opening the cover member 15.

Figure 17:
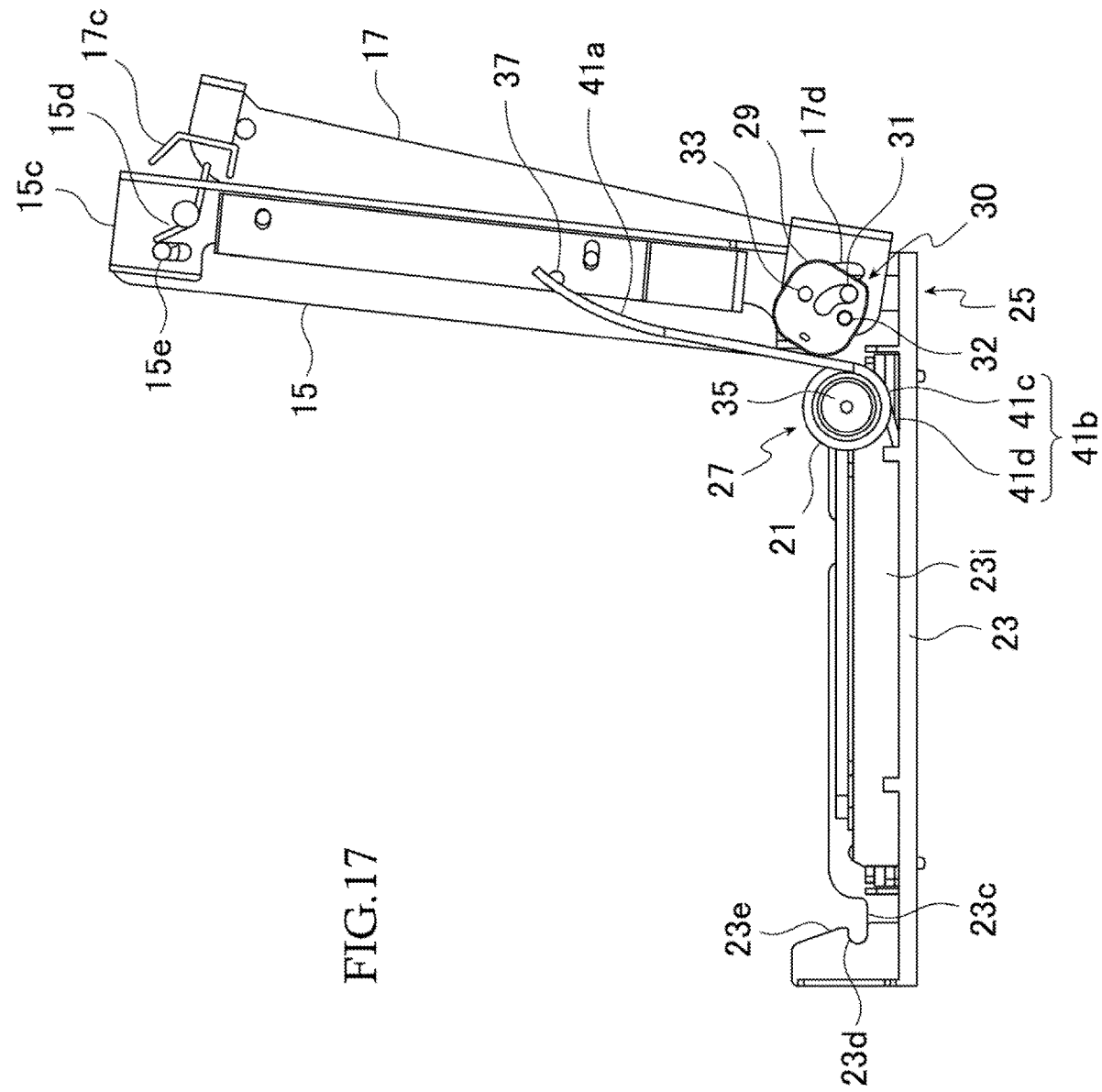
FIG. 17 is a diagram explaining an operation of the biasing means of an IC socket according to the embodiment of the present invention, and shows the state that the cover member is fully opened.

As shown in FIG. 17, while the cover member 15 is opened to the fully open position, the biasing force is reduced inversely proportional to the degree of opening of the cover member 15, and while the cover member 15 is rotated in the direction in which the cover member 15 opens and fully opens, the IC package 11 can be taken out from the socket body 13.

According to the opening/closing mechanism of the IC socket 10 according to the present embodiment, the lever member 17 supported pivotally on the socket body 13 by the first shaft 31 and the cover member 15 are mounted to the link plate 29 by the second shaft 32 and the third shaft 33, and if the lever member 17 is rotated in the direction of closing, the link plate 29 operates so that the cover member 15 is pushed down.

Thus, the force received by the cover member 15 is loaded to the lever member 17 through the link plates 29, and the force loaded to the lever member 17 can be reduced by properly adjusting the arrangement of the link plates 29 and the second and third shafts 32, 33.

Accordingly, even if the force received from the socket body 13 side to the cover member 15 is increased, the cover member 15 can be easily pushed down by the lever member 17 and the operability of the lever member 17 can be improved.

According to the opening/closing mechanism of the IC socket 10 of the present embodiment, the third shaft 33 for mounting the cover member 15 to the link plate 29 is vertically movably supported on the base portion 23 of the socket body 13, so that the cover member 15 can be directly connected to the socket body 13 and raised and lowered at the predetermine position. Accordingly, the cover member 15 can be opened and closed in the predetermined position with respect to the socket body 13 to raise and lower the cover member 15.

According to the opening/closing mechanism of the IC socket 10 according to the present embodiment, the second shaft 32 is disposed lateral one side with respect to the first shaft 31 at the state that the lever member 17 is open, and the second shaft 32 moves below the first shaft 31 by rotating the lever member 17 to the closing direction about the first shaft center of the first shaft 31. Thus, when an upward force is loaded to the cover member 15, this upward force is transferred to the second shaft 32 via the third shaft 33 and the link plate 29. While the second shaft 32 is positioned laterally with respect to the first shaft 31, the upward force is loaded to open the lever member 17 in the opening direction and it is necessary to operate the lever member 17 against this upward force. However, if the lever member 17 is rotated around the first shaft 31 and the second shaft 32 is moved below the first shaft 31, the upward force from the cover member 15 is more supported on the first shaft 31, thereby reducing the force loaded in the direction of opening the lever member 17. Therefore, by rotating more in the closing direction, the force for operating the lever member 17 can be reduced.

In particular, in the opening/closing mechanism of the IC socket 10 of this embodiment, the second shaft center of the second shaft 32 moves beyond right below the first shaft center of the first shaft 31 from the lateral one side of the first shaft center of the first shaft 31 to the lateral other side of the first shaft center of the first shaft 31. Therefore, when the lever member 17 is rotated in the closing direction and exceeds right below the first shaft center, the upward force from the cover member 15 is loaded on the opposite side of the link plate 29 beyond the first shaft center. Then, the link plate 29 is loaded to rotate in the opposite direction to bias the lever member 17 in the closing direction. As a result, the lever member 17 rotated to close the cover member 15 is loaded with a force in the closing direction, thereby allowing that as if the lever member 17 would be locked.

According to the opening/closing mechanism of the IC socket 10 of the present embodiment, since a plurality of link plates 29 are provided and the lever member 17 is disposed between the plurality of link plates 29, the force received by the cover member 15 is transmitted to the link plates 29 on both sides of the lever member 17, and the lever member 17 is loaded balanced from the link plates 29 on both sides. Therefore, even if a large force is loaded from the cover member 15, the lever member 17 can be operated smoothly and operability can be ensured.

In addition, the lever member 17 is disposed between the plurality of the link plates 29, the first shaft 31 is passed through the first escape hole 29a of the plurality of the link plates 29, and the third shaft 33 is passed through the third escape hole 17d of the lever member 17. Thus, the plurality of link plates 29 and the lever member 17 are combined to form a structure which secures strength by mutually reinforcing. Therefore, even if a large force is loaded from the cover member 15, deformation, etc. is difficult to occur, and the operability of the lever member 17 can be ensured.

In particular, in the opening/closing mechanism of the IC socket 10 of this embodiment, the socket body 13 includes a plurality of base connection pieces 23a, and the plurality of link plates 29 and the lever member 17 are disposed between the plurality of base connection pieces 23a and the first shaft 31 is bridged between the plurality of base connection pieces 23a. Therefore, the plurality of link plates 29 and lever member 17 can be stably supported, and stable operation is possible even if a large force is loaded from the cover member 15.

According to the opening/closing mechanism of the IC socket 10 of the present embodiment, the spring member 21 that biases the cover member 15 in the direction of opening has the spring extending portion 41a extending from the spring base portion 41b, the spring support portion 35 that supports the spring base portion 41b is provided on the base portion 23, and the spring receiver 37 that abuts the spring extending portion 41a is provided on the cover member 15.

Accordingly, the cover member 15 is biased in the direction of opening of the cover member 15 by the biasing force corresponding to the distance from the spring base portion 41b of the spring member 21 to the abutting position in the spring extending portion 41a abutting with the spring receiver 37. In this embodiment, the distance from the spring base portion 41b of the spring member 21 to the abutting position in the spring extending portion 41a abutting with the spring receiver 37 increases in accordance with the opening of the cover member 15. Therefore, the spring member 21 reduces the biasing force as the cover member 15 opens more, and the cover member 15 can be biased by the spring member 21 in according with the degree of opening of the cover member 15.

As a result, when the IC package 11 is mounted or dismounted, at the beginning of opening of the cover member 15, the distance from the spring base portion 41b to the abutting position in the spring extending portion 41a abutting with the spring receiver 37 is short and the biasing force can be strengthened. Therefore, even if the center of gravity of the cover member 15 is far from the third shaft 33 as the rotating shaft, the cover member 15 can be rotated in the direction in which the cover member 15 is easily opened.

On the other hand, when the cover member 15 is raised up by a large opening, the distance from the spring base portion 41b to the abutting position in the spring extending portion 41a abutting with the spring receiver 37 becomes long and the biasing force decreases, and since the center of gravity of the cover member 15 approaches the third shaft 33 as the rotating shaft, the cover member 15 can be rotated in a direction in which the cover member 15 is easily opened. When the cover member 15 is stopped in the fully opened state, the biasing force is reduced and the impact at the stop position can be greatly reduced.

In the opening/closing mechanism of the IC socket 10 according to the present embodiment, since the spring member 21 is a screw coil spring, by disposing the spring base portion 41b composed of the coil portion 41c and the fixing portion 41d on the third shaft 33 side, it is easy for the spring extending portion 41a of the wire to be extended long in a direction that is spaced from the third shaft 33, so that the biasing force at the time of opening/closing of the cover member 15 is easily changed significantly.

In the opening/closing mechanism of the IC socket 10 according to the present embodiment, the spring member 21 is disposed on the side surface of the base member 23 and the cover member 15. Therefore, even if the spring extending portion 41a of the spring member 21 is provided in a long length, the spring extending portion 41a can be disposed along the base member 23 and the cover member 15 without providing an additional placement space. Thus, the spring member 21 can be easily disposed along the base member 23 and the cover member 15.

According to the IC socket 10 of the present embodiment, the cover member 15 and the lever member 17 are connected to the same side edge side of the socket body 13, and a pressing means 25 for pushing down the cover member 15 is provided. Thus, a structure to rotatably support the lever member 17 and a structure to rotatably support the cover member 15 can be provided on the same side surface side of the socket body 13, and the cover member 15 can be pushed down by the lever member 17.

This enables to simplify the structure of the side surface side of the socket body opposite to the side surface that the lever member 17 and the cover member 15 are pivotally supported, and it is possible to make smaller or eliminate such a portion that is disposed to be protruded from the socket body 13. Accordingly, when the cover member 15 is opened, the side surface side that the lever member 17 and the cover member 15 are not supported can be widely opened, so that the IC package 11 can be easily accommodated, and a large IC package 11 can be mounted and used.

According to the IC socket 10 of the present embodiment, the cover member 15 is vertically movably connected to the socket body 13 and is connected to the lever member 17 by the link plate 29 as a link member. Therefore, by closing the lever member 17, the cover member 15 can be easily pushed down to the predetermined position of the socket body 13.

According to the IC socket 10 of the present embodiment, the base connection piece 23a, the cover connection piece 15a and the lever connection piece 17a are arranged in parallel along the rotation direction, and the link plate 29 connecting these pieces 15a, 17a, and 23a is also arranged in parallel with each of the connection pieces 15a, 17a and 23a. Therefore, it is easy to construct compactly a structure for rotatably supporting the lever member 17 and the cover member 15 and a structure for pushing down the cover member 15 on the same side of the socket body 13 by connecting the connection pieces 15a, 17a and 23a closely together.

According to the IC socket 10 of the present embodiment, the link member comprises a link plate 29 disposed between the connection pieces 15a, 17a and 23a, and the link pieces 15a, 17a and 23a are connected through the escape hole 29a of the link plate 29. Accordingly, each of the connection pieces 15a, 17a, 23a and the link plate 29 can be combined to reinforce each other, and sufficient strength can be easily secured even if the structure for rotatably supporting the lever member 17 and the cover member 15 and the structure for pushing down the cover member 15 are compactly provided on the same side of the socket body 13.

According to the IC socket 10 of the present embodiment, the long hole 23h is provided on the socket body 13 to movably support the cover member 15, the third shaft 33 supported by the long hole 23h is provided on the cover member 15, and the cover member 17 is configured to be closed so that the cover member 17 is pushed down along the long hole 23h. Therefore, the pushing direction and the amount of pushing down of the cover member 17 can be set by the long hole 23h of the socket body 13, and the pushing direction and the amount of pushing down of the IC package 11 that are pushed down by the cover member can be set. This allows the contact pins 19a of the socket body 13 to be pressed by contacting the terminals of the IC package 11 in an appropriate direction, and more appropriately pushing down the IC package 11 depending on the contact pins 19a and the terminals of the IC package 11 can become possible.

According to the IC socket 10 of the present embodiment, the cover member 15 is movably and rotatably supported in the long hole 23h on the third shaft 33 at the cover proximal end 15b, and the cover distal end 15c in the closed state is supported in contact with the distal end support portion 23c of the socket body 13 in the direction of opening. Therefore, when the cover member 15 is closed and the cover distal end 15c is supported to the distal end support portion 23c of the socket body 13, the cover member 15 can be pressed down along the long hole 23h by the lever member 17.

In this case, since the cover distal end 15c is movably supported in contact with the distal end support portion 23c of the socket body 13 in the direction of opening, the cover distal end portion 15c can also be displaced at the distal end support portion 23c when the cover proximal end portion 15b moves down along the long hole 23h in the intersecting direction, thereby allowing the cover member 15 to be easily pushed down along the long hole 23h.

According to the IC socket 10 of the present embodiment, since the cover proximal end 15b is coupled to the lever member 17 through the link plate 29 as the link member, the cover proximal end 15b can be easily displaced along the long hole 23h by operation of the lever member 17.

According to the IC socket 10 of the present embodiment, since the long hole 23h is formed in a straight line along the contact direction set in the contact pin 19a of the socket body 13, resistance is difficult to occur when the lever member 17 is pushed down, so that the terminal of the IC package 11 can be easily pressed against the contact pin 19a with sufficient force.

Still, the above embodiment may be modified as appropriate within the scope of the present invention.

Figure 12:
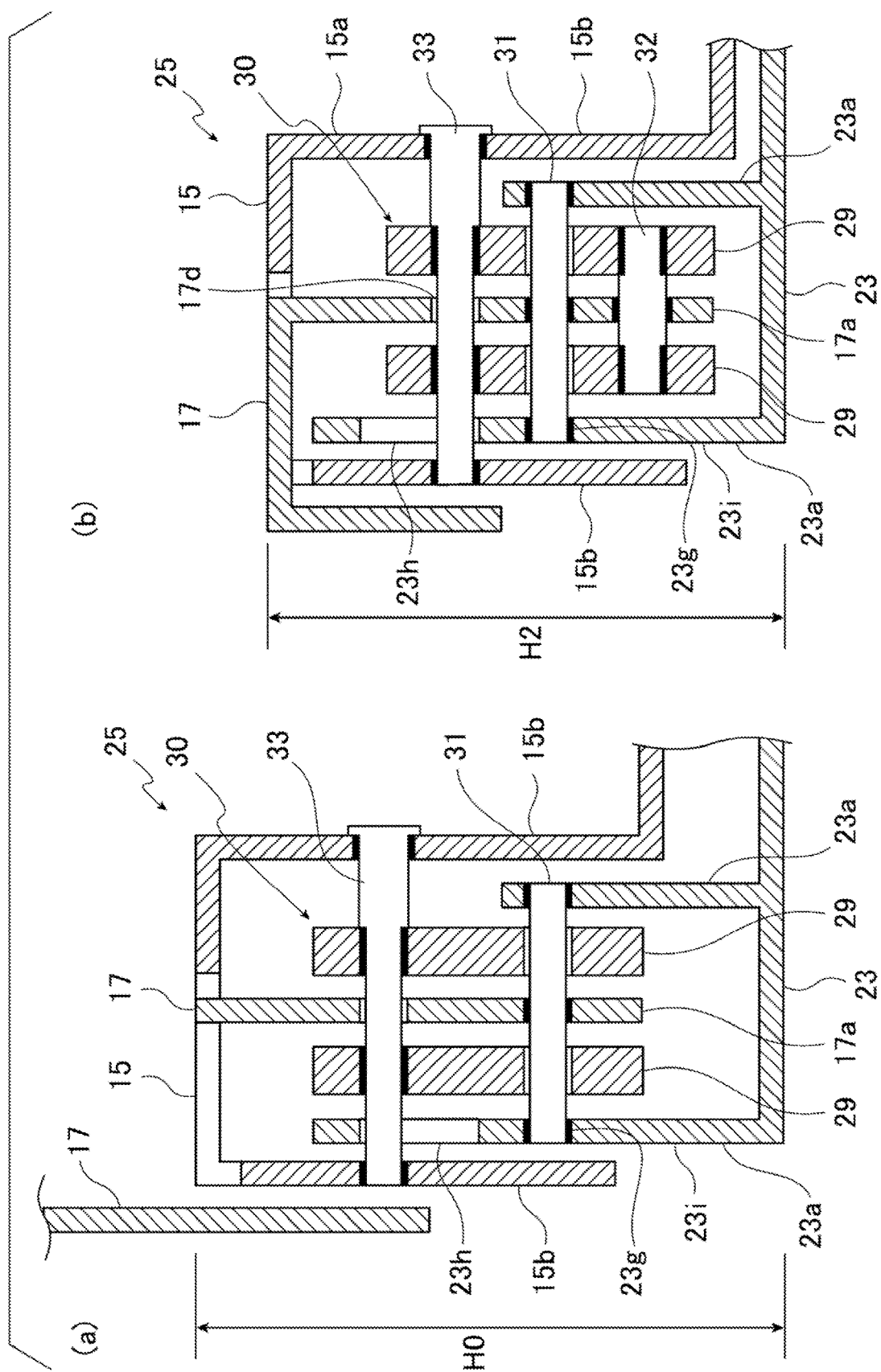
FIG. 12 is a longitudinal cross-sectional view in a width direction illustrating the pressing means of an IC socket according to the embodiment of the present invention, in which (a) indicates that the lever member is opened and (b) indicates that the lever member is closed.
Figure 13:
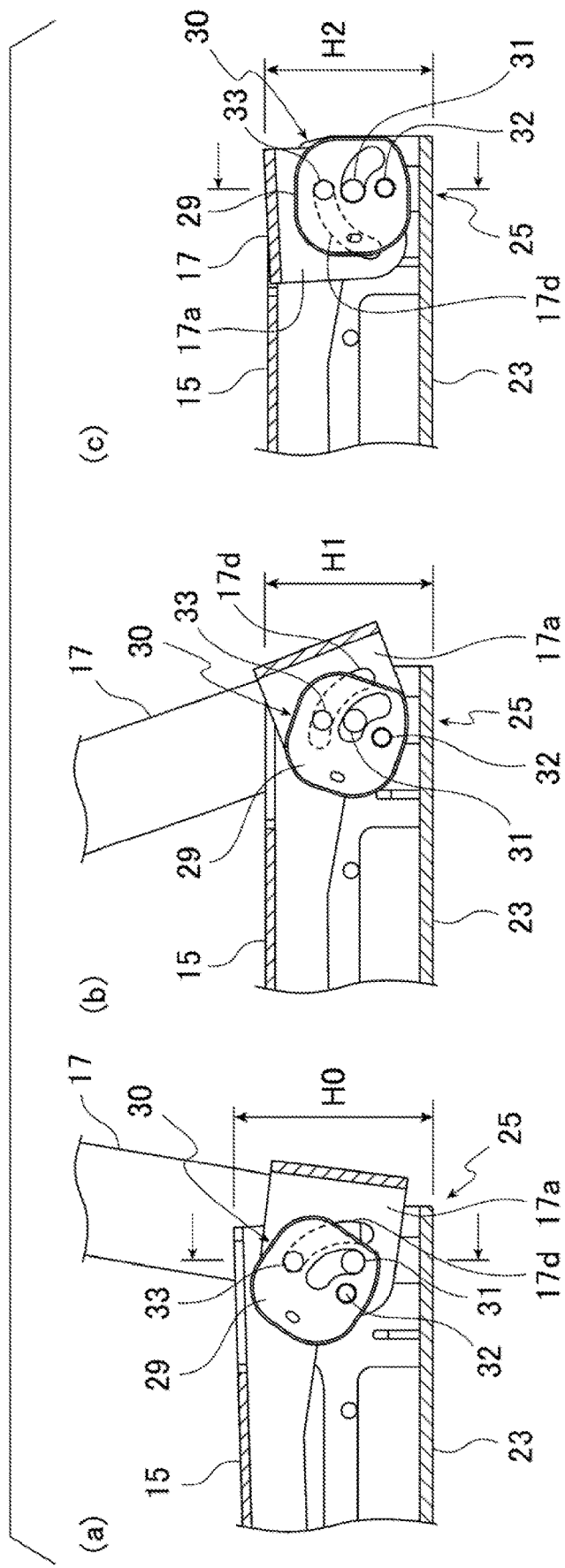
FIG. 13 is a longitudinal cross-sectional view in a front and back direction illustrating the pressing means of the IC socket according to the embodiment of the present invention, in which (a) indicates that the lever member is fully opened, (b) indicates that the lever member is half opened, and (c) indicates that the lever member is fully closed.

For example, in the above-described example, a long hole 23h is provided in a substantially linear fashion. However, the long hole 23h is not particularly limited. For example, as shown in FIG. 12, the long hole 23h may have a guide comprising an inclined portion that is inclined in a direction intersecting the contact direction set on the contact pin 19a of the socket body 13.

In the above-described embodiment, the spring support portion 35 for supporting the spring base portion 41b is disposed in the base portion 23, and the spring receiver 37 for abutting the spring extending portion 41a is disposed in the cover member 15. However, the present invention can be applied without any difference even if the spring support portion 35 for supporting the spring base portion 41b is disposed in the cover member 15 and the spring receiver 37 for abutting the spring extending portion 41a is disposed in the base portion 23.

Further, although the screw coil spring with a wire wound is used in the above-described description, the spring member may be enough if it can change the biasing force by changing the abutting position, and may be another spring member 21, such as a leaf spring.

In addition, in the above-described embodiment, the long hole 23h formed in substantially linear is illustrated as an example. However, it is not particularly limited so. It may be a long hole that is inclined in a direction intersecting the contact direction set on the contact pin 19a of the socket body 13.

In this case, the same effect as that of the above-described embodiment is obtained, and the cover member 15 is pushed down by pushing down the lever member 17, so that the long hole 23h allows the terminal of the IC package 11 to come into contact with the contact pin 19a while moving in the intersecting direction together with the cover member 15.

As a result, by moving the contact pin 19a in contact with the surface of the terminal, the coating or foreign matter present on the surface of the terminal can be removed, and then the contact pin 19a can be strongly contacted, so-called wiping can be performed.

EXPLANATION OF REFERENCE

10 IC socket
11 IC package
13 socket body
15 cover member
15a cover joints
15b cover proximal end
15c cover distal end
15d movable supported portion
15e shaft
17 lever member
17a lever connection piece
17c operation piece
17d third escape hole 19 contact pin unit
19a contact pin
21 spring member
23 base portions
23a base connection piece
23c distal end support portion
23d contact support portion
23e guide portion
23g first support hole
23h long hole
23i front and rear frame piece
25 pressing means
27 biasing means
29 link plate
29a first escape hole
30 rotating link mechanism
31 first shaft
32 second shaft
33 third shaft
35 spring support portion
37 spring receiver
41a spring extending portion
41b spring base
41c coil portion
41d fixing portion

The invention claimed is:

1. An opening/closing mechanism of an opening/closing body, comprising:
   a first shaft by which a lever member is rotatably supported on a base portion;
   a second shaft by which a link plate is attached to the lever member; and
   a third shaft by which a cover member is attached to the link plate, wherein
      the link plate operates through the second shaft by rotating the lever member to a closing direction of the lever member about a first shaft line of the first shaft,
      the cover member is pushed down through the third shaft by operating of the link plate,
      the third shaft is vertically movably supported on the base portion,
      the second shaft is disposed lateral one side with respect to the first shaft at the state that the lever member is open, and the second shaft moves below the first shaft by rotating the lever member to the closing direction about the first shaft line of the first shaft, and
      a second shaft line of the second shaft moves beyond right below the first shaft line of the first shaft from the lateral one side of the first shaft line of the first shaft to lateral other side of the first shaft line of the first shaft.

2. An opening/closing mechanism of an opening/closing body, comprising:
   a first shaft by which a lever member is rotatably supported on a base portion;
   a second shaft by which a link plate is attached to the lever member; and
   a third shaft by which a cover member is attached to the link plate, wherein
      the link plate operates through the second shaft by rotating the lever member to a closing direction of the lever member about a first shaft line of the first shaft,
      the cover member is pushed down through the third shaft by operating of the link plate,
      a plurality of the link plates are provided,
      the lever member is disposed between the plurality of the link plates,
      the first shaft is passed through a first escape hole of the plurality of the link plates, and
      the third shaft is passed through a third escape hole of the lever plate.

3. The opening/closing mechanism of an opening/closing body according to claim 2, wherein
   the base portion includes a plurality of base connection pieces, and
   the plurality of base connection pieces and the lever member are disposed between the plurality of connection pieces and the first shaft is bridged between the plurality of connection pieces.

4. An apparatus comprising:
   a socket body having a space in which an electrical component is housable, and including base portion having a longitudinally extending hole;
   a contact pin that longitudinally extends in a same direction as the hole of the base portion;
   a first shaft supported on the base portion;
   a lever member rotatable about a shaft line of the first shaft in a closing direction and in an opening direction opposite to the closing direction;
   a link plate;
   a second shaft attaching the link plate to the lever member;
   a cover member; and
   a third shaft attaching the cover member to the link plate, and supported so as to be movable in the hole of the base portion in the direction that the hole longitudinally extends, with the cover member being rotatable about a shaft line of the third shaft,
   wherein rotation of the lever member about the shaft line of the first shaft in the closing direction with the electrical component housed in the space of the socket body causes the link plate to operate through the second shaft so as to rotate the cover member about the shaft line of the third shaft so that the cover member presses the electrical component to thereby cause the electrical component to contact the contact pin.

5. The apparatus according to claim 4, wherein
   the lever member is rotatable about the shaft line of the first shaft in the opening direction to a position where the lever member is in an open position and the third shaft is at a first position in the hole of the base portion, and
   the lever member is rotatable about the shaft line of the first shaft in the closing direction from the position where the lever member is in the open position and the third shaft is at the first position in the hole of the base portion, to a position where the lever member is in a closed position and the third shaft is at a second position, different from the first position, in the hole of the base portion.

6. The apparatus according to claim 4, wherein
   the hole of the base portion and the contact pin longitudinally extend in a vertical direction, and
   the second position is lower than the first position.

7. An apparatus comprising:
   a socket body having a space in which an electrical component is housable, and including base portion having a hole that longitudinally extends in a vertical direction;
   a contact pin;
   a first shaft supported on the base portion;

a lever member rotatable about a shaft line of the first shaft in a closing direction and in an opening direction opposite to the closing direction;

a link plate;

a second shaft attaching the link plate to the lever member;

a cover member; and a third shaft attaching the cover member to the link plate, and supported so as to be vertically movable in the hole of the base portion, with the cover member being rotatable about a shaft line of the third shaft, wherein rotation of the lever member about the shaft line of the first shaft in the closing direction with the electrical component housed in the space of the socket body causes the link plate to operate through the second shaft so as to rotate the cover member about the shaft line of the third shaft so that the cover member presses the electrical component to thereby cause the electrical component to contact the contact pin.

8. The apparatus according to claim 7, wherein the lever member is rotatable about the shaft line of the first shaft in the opening direction to a position where the second shaft is disposed laterally to one side of the first shaft, and the lever member is rotatable about the shaft line of the first shaft in the closing direction to a position where the second shaft is below the first shaft.

9. The apparatus according to claim 8, wherein the lever member is rotatable about the shaft line of the first shaft in the closing direction from the position where the second shaft is below the first shaft to a position where the second shaft is disposed laterally to an other side, opposite to the one side, of the first shaft.

10. The apparatus according to claim 7, further comprising:

a plurality of the link plates, wherein the lever member is disposed between the plurality of the link plates, each link plate of the plurality of link plates including an escape hole, the first shaft passes through the escape hole of each link plate of the plurality of the link plates, the lever member has an escape hole, and the third shaft passes through the escape hole of the lever member.

11. The apparatus according to claim 10, wherein the base portion includes first and second base connection pieces, and the plurality of link plates and the lever member are disposed between the first and second base connection pieces, and the first shaft is bridged between the first and second base connection pieces.

12. The apparatus according to claim 7, wherein the contact pin longitudinally extends in the vertical direction.

13. The apparatus according to claim 7, wherein the lever member is rotatable about the shaft line of the first shaft in the opening direction to a position where the lever member is in an open position and the third shaft is at a first position in the hole of the base portion, and the lever member is rotatable about the shaft line of the first shaft in the closing direction from the position where the lever member is in the open position and the third shaft is at the first position in the hole of the base portion, to a position where the lever member is in a closed position and the third shaft is at a second position, lower than the first position, in the hole of the base portion.

* * * * *